United States Patent [19]

Campbell et al.

[11] Patent Number: 5,228,863
[45] Date of Patent: Jul. 20, 1993

[54] CONNECTION DEVICE FOR USE IN AN ELECTRICAL CIRCUITRY SYSTEM

[75] Inventors: Jeffrey S. Campbell, Vestal; David B. Howe, Binghamton, both of N.Y.

[73] Assignee: International Business Machines Corporation, Armonk, N.Y.

[21] Appl. No.: 914,707

[22] Filed: Jul. 15, 1992

Related U.S. Application Data

[63] Continuation-in-part of Ser. No. 737,966, Jul. 30, 1991, abandoned.

[51] Int. Cl.$^5$ .............................................. H01R 9/09
[52] U.S. Cl. ..................................... 439/67; 439/493
[58] Field of Search ................................. 439/59–64, 439/65, 66, 67, 77, 493

[56] References Cited

U.S. PATENT DOCUMENTS

| 4,250,536 | 2/1981 | Barringer et al. | 361/413 |
| 4,439,815 | 3/1984 | Close et al. | 361/386 |
| 4,629,270 | 12/1986 | Andrews, Jr. et al. | |
| 4,636,019 | 1/1987 | Gillett et al. | |
| 4,695,258 | 9/1987 | Hanson et al. | 439/67 |
| 4,744,764 | 5/1988 | Rubenstein | 439/62 |
| 4,808,112 | 2/1989 | Wood et al. | 439/66 |
| 4,881,901 | 11/1989 | Mendenhall et al. | 439/65 |
| 4,892,487 | 1/1990 | Dranchak et al. | 439/260 |
| 4,907,975 | 3/1990 | Dranchak et al. | 439/67 |
| 4,913,656 | 4/1990 | Gordon et al. | 439/67 |
| 5,156,553 | 10/1992 | Katsumata et al. | 439/493 |
| 5,161,986 | 11/1992 | Gulbranson et al. | 439/493 |
| 5,171,154 | 12/1992 | Casciotti | 439/493 |

FOREIGN PATENT DOCUMENTS

3422768A1 6/1984 Fed. Rep. of Germany.

OTHER PUBLICATIONS

High Density Flexible Connector, vol. 32, No. 7, Dec. 1989. pp. 344–345.

Primary Examiner—Neil Abrams
Attorney, Agent, or Firm—Calfee, Halter & Griswold

[57] ABSTRACT

A connection device is provided for electrically coupling a primary circuit surface to a companion circuit surface via a flexible circuit strip for interconnecting the circuit surfaces. The connection device includes a companion positioner which has a companion-coordinating side, and a primary positioner which is coupled to the companion-coordinating side and which includes a primary-coordinating side. The companion coordinating side is adapted to be positioned parallel to the companion circuit surface, and includes a set of companion-positioner registrants for precisely positioning the companion-positioner relative to the companion circuit surface and a section of the interfacing circuit surface. The primary-coordinating side is adapted to be positioned parallel to the primary circuit surface, and includes a set of primary-positioner registrants for precisely positioning said primary-positioner relative to the primary circuit surface and another section of the interfacing circuit surface. The primary-positioner is selectively adjustable, independent of the companion-positioner, in two perpendicular directions defining a primary adjustment area parallel to the primary-coordinating side of said connection device.

39 Claims, 18 Drawing Sheets

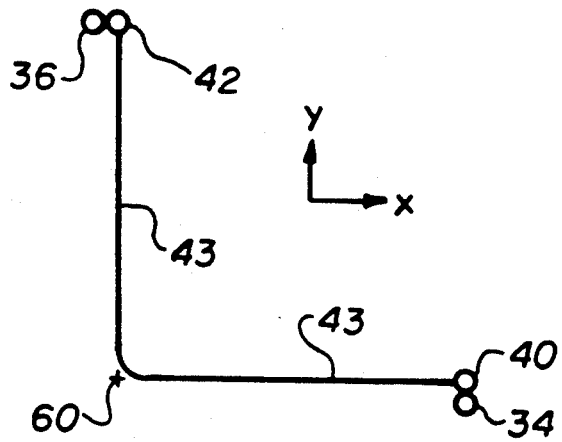
FIG. 4A1
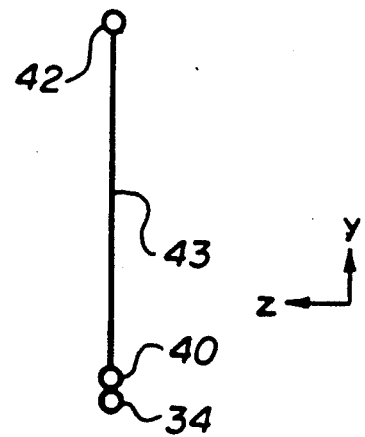
FIG. 4A2
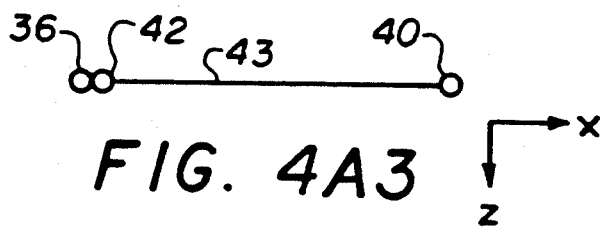
FIG. 4A3
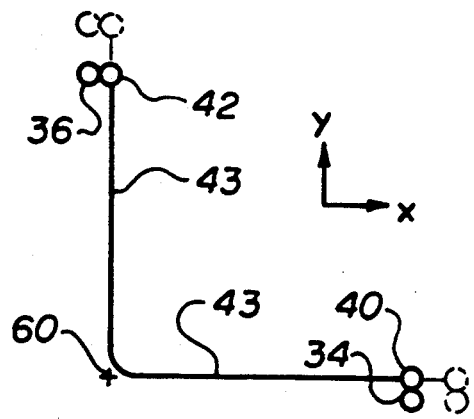
FIG. 4B1
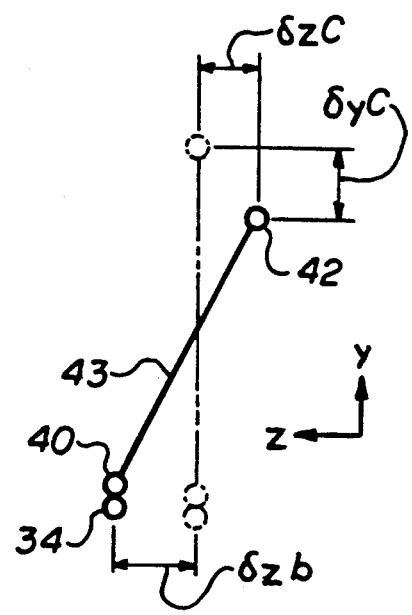
FIG. 4B2
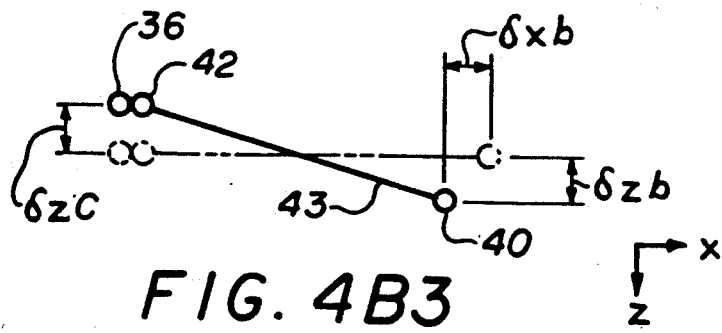
FIG. 4B3

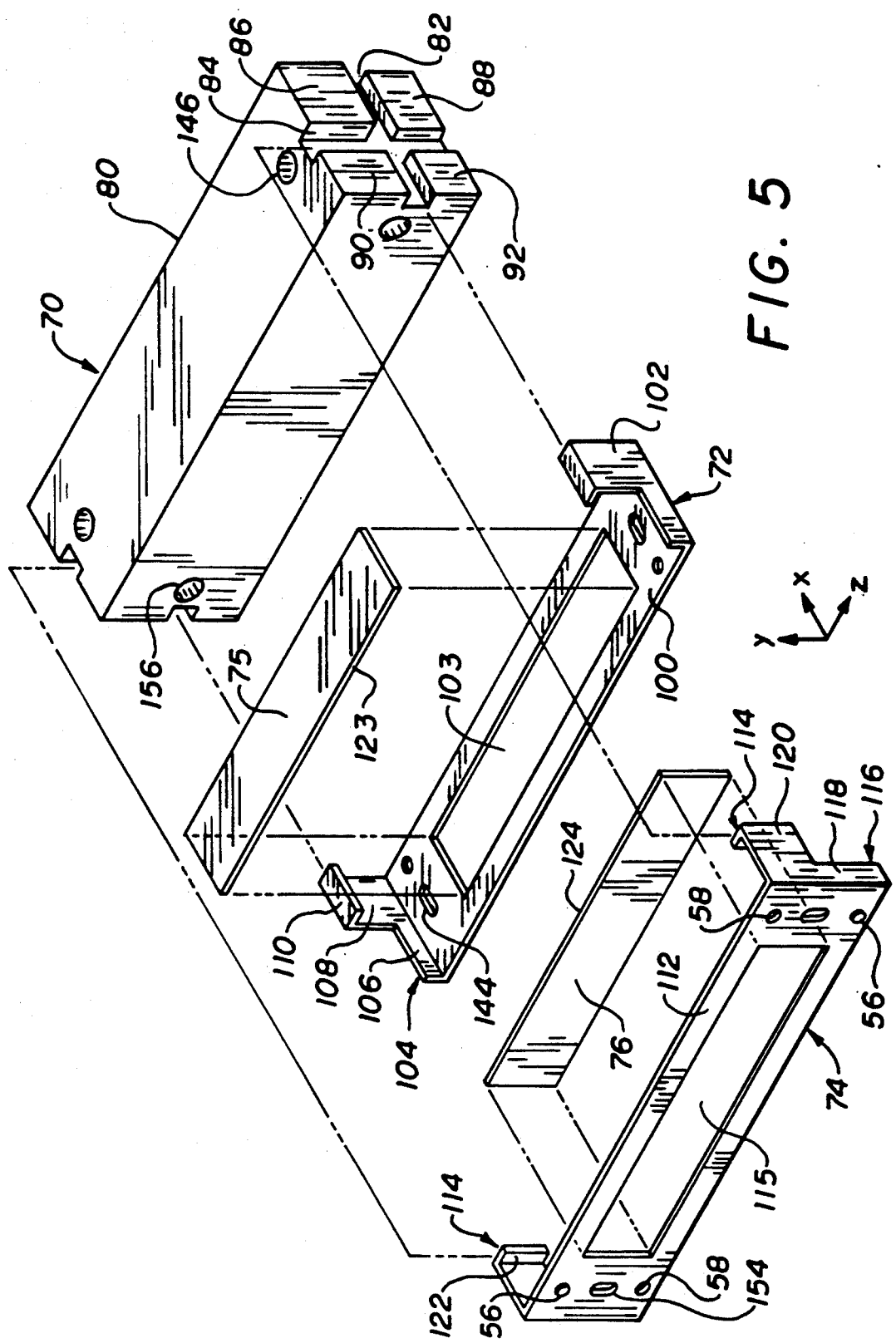

CONNECTION DEVICE FOR USE IN AN ELECTRICAL CIRCUITRY SYSTEM

RELATED APPLICATIONS

This application is a continuation-in-part of copending U.S. application Ser. No. 07/737,966 which is entitled "Connection Device for Use in an Electrical Circuitry System" which was filed on Jul. 30, 1991 and is now abandoned.

FIELD OF THE INVENTION

This invention relates generally, as indicated, to a connection device for use in an electrical circuitry system. More particularly, this invention relates to a connection device for electrically coupling a primary circuit surface to a companion circuit surface via a multisection interfacing circuit surface.

BACKGROUND OF THE INVENTION

Electrical circuitry systems are commonly an integral part of data processing and other types of equipment. A typical electrical circuitry system will comprise a collection of components which, when connected together in an appropriate manner, will establish a desired electrical flow pattern. For example, an electrical circuitry system will often include a component defining a primary circuit surface, such as a mother board, and a component defining a companion circuit surface, such as a daughter card. Some more complex electrical circuitry systems may further include a plurality of companion circuit surfaces and/or daughter cards.

The component defining the primary circuit surface is usually, although not always, of a rigid, planar, construction and contains a set of primary electrical contacts arranged in a primary-contact pattern. Likewise, the component defining the companion circuit surface will typically be of a rigid, planar construction, and, in the assembled system, will usually extend perpendicularly from the primary circuit surface. In any event, the companion circuit surface will contain a set of companion electrical contacts arranged in a companion-contact pattern.

When the corresponding primary and companion contacts are electrically coupled together, electrical signals will be transmitted from component to component. Thus establishing the desired electrical connection between such contacts is crucial in the assembly of an electrical circuitry system. To this end, such systems will usually include interfacing and/or connecting components which function to electrically couple the primary circuit surface to the companion circuit surface.

The interfacing component, whatever its form, will usually include a set of primary-interfacing contacts and a set of companion-interfacing contacts. Each of the companion-interfacing contacts will be electrically connected in some manner to a corresponding primary-interfacing contact. The primary-interfacing contacts are arranged in a pattern corresponding to the primary contact pattern; the companion-interfacing contacts are arranged in a pattern corresponding to the companion contact pattern. In a typical application, the various contact patterns, or artwork, will be very elaborate and the electrical contacts will be very small in size. By way of example, the density setting of the contacts may be in the range of 200 contacts per inch.

In recent years, flexible circuit film has been a desirable choice as an interfacing component in an electrical circuitry system. A typical strip of flexible circuit film will be comprised of printed circuitry on a thin, pliable substrate, and the "bendable" nature of the substrate will allow the necessary degree of movement between sections of the flexible circuit strip without affecting the electrical integrity of the interfacing component or circuit surface. The current popularity in flexible circuit film is especially apparent when the contact patterns are of a very high density setting, such as 200 contacts per inch. Flexible circuit strips are being increasingly used due to their ability to provide a high density interconnect with controlled impedance.

In any event, when a flexible circuit strip is used as an interfacing component, it will commonly include a primary-interfacing section containing the set of primary-interfacing contacts and a companion-interfacing section containing the set of companion-interfacing contacts. The desired electrical transmission between the mother board and the daughter card is accomplished by mating a board, or primary, contact with the corresponding primary-interfacing contact, and by mating the corresponding companion-interfacing contact with the corresponding card, or companion, contact. When an electrical connection is accomplished for each array of corresponding electrical contacts, the desired electrical connection will be established between each board contact and card contact.

Thus, to insure that the proper electrical connection is made between the mother board and the daughter card, the proper alignment of the board contacts relative to the primary-interfacing contacts, and the proper alignment of the card contacts relative to the companion-interfacing contacts, is very important. To accomplish this proper alignment, the components will usually be provided with coordinating alignment elements, or registrants which are precisely positioned relative to the electrical contacts. When the registrants are mated, or "registered", in the correct manner, the primary-interfacing contacts will be precisely positioned relative to the board, or primary, contacts. Additionally, the companion-interfacing contacts will be precisely positioned relative to the card or companion contacts.

In addition to an interfacing component, an electrical circuitry system will commonly include a connection component. The connection component, although usually not containing any electrical contacts itself, will be designed to electrically couple the interfacing component to the primary circuit surface and/or companion circuit surface. As such, the connection device may also include registrants for coordination with the registrants of the other components in their alignment together in the system.

Due to the precise positioning of the alignment members in relation to the respective electrical contacts, the coordination therebetween will result in the desired transmission of electrical signals between the primary circuit surface and the companion circuit surface. However, in this regard, it is important to note that although the registrants are precisely located relative to the relevant electrical contacts, the positioning of the registrants, and thus the electrical contacts, may not be precisely aligned relative to the overall geometry of the respective component. For example, the registrants on the mother board and/or the daughter card may not be precisely positioned relative to the pertinent edges of these components.

Thus, to insure proper electrical alignment in an electrical circuitry system, it must be possible to mate, or register, registrants which are not precisely aligned relative to the overall geometry of the respective component. Any necessary adjustments would preferably be made by the interfacing or connecting component rather than the rigid components of the electrical circuitry system, such as the mother board and the daughter card. To this end, it is noted that if a flexible circuit strip is used as an interfacing component, the flexible nature of the strip would allow such manipulation without affecting the integrity of its electrical contacts. However, in most connection components, no provision has been made to provide individual floating registration of the flexible circuit strip.

Applicants, therefore, believe that a need exists for an improved connection device for electrically coupling a primary circuit surface to a companion circuit surface via an interfacing circuit surface. Such an improved connection device would be preferably designed so that it may be used with interfacing circuit surfaces having relatively short lead lengths resulting in high electrical performance and low cost. Additionally, a construction which reduces tolerance build-up is desirable so that a high interconnect density is possible. Still further, a connection device design which made the device easy to install and replace in the field, would be helpful in the assembly of electrical circuitry systems.

SUMMARY OF THE INVENTION

The present invention provides a connection device for electrically coupling a primary circuit surface to a companion circuit surface via a multi-section interfacing circuit surface. The connection device is designed so that it may be used with interfacing circuit surfaces having relatively short lead lengths resulting in high electrical performance and low cost. Additionally, it is adapted to allow for a reduction in tolerance build-up whereby a high interconnect density is possible. Still further, the connection device is designed so that it is easy to install and replace in the field.

The connection device according to the present invention particularly comprises a companion-positioner including a companion-coordinating side which is adapted to be positioned parallel to the companion circuit surface, and which includes a set of companion positioner registrants for precisely positioning the companion-positioner relative to the companion circuit surface and a section of the interfacing circuit surface. The connection device further comprises a primary positioner coupled to the companion-positioner and including a primary-coordinating side. The primary-coordinating side is adapted to be positioned parallel to the primary circuit surface, and includes a set of primary-positioner registrants for precisely positioning the primary-positioner relative to the primary circuit surface and another section of the interfacing circuit surface. The primary-positioner is selectively adjustable and independent of the companion-positioner in two perpendicular directions defining a primary adjustment area parallel to the primary-coordinating side of the connection device.

The connection device further comprises an elastomeric primary-flattener for applying a primary flattening force on the interfacing circuit surface. This flattening force is in a direction substantially perpendicular to the primary adjustment area and outwardly from the primary-coordinating side.

In one embodiment, the primary-positioner and the companion-positioner are of a modular and essentially identical configuration whereby they may be used interchangeably in the assembly of the connection device. Consequently, the companion-positioner is also selectively adjustable and independent of the primary-positioner in two perpendicular directions defining a companion adjustment area which is parallel to the companion-coordinating side of the connection device. Additionally, the device includes an elastomeric companion-flattener for applying a companion flattening force on the interfacing circuit surface. This flattening force is in a direction substantially perpendicular to the companion adjustment area and outwardly from the companion-coordinating side. In another embodiment, the connection device includes a primary-positioner which is made of an elastomeric material whereby it may also function as an elastomeric primary-flattener.

The present invention also provides an electrical circuitry system which includes a primary circuit surface, a companion circuit surface, an interfacing circuit surface, and a connection device. The connection device electrically couples the primary circuit surface to the companion circuit surface via the interfacing circuit surface. The primary circuit surface includes a set of electrical primary contacts which are arranged in a certain primary-contact pattern; the companion circuit surface includes a set of electrical companion contacts which are arranged in a certain companion-contact pattern. The interfacing circuit surface includes a primary-interfacing section on which a set of primary-interfacing electrical contacts are arranged in a pattern corresponding to the primary-contact pattern and a companion-interfacing section on which a set of companion-interfacing contacts are electrically connected to the primary-interfacing contacts and are arranged in a pattern corresponding to the companion-contact pattern. The primary-interfacing section and the companion-interfacing section are joined together in such a manner that limited relative movement therebetween is possible. The connection device includes a companion-positioner coupled to the companion-interfacing section and to the companion circuit surface in such a manner that the companion-interfacing section is positioned between the companion-positioner and the companion circuit surface and the companion-interfacing contacts are precisely positioned relative to the companion-contacts. The connection device further includes a primary-positioner coupled to the primary-interfacing section and to the primary circuit surface in such a manner that the primary-interfacing section is positioned between the primary-positioner and the primary circuit surface, the primary-positioner being adjustable, independently of the companion-positioner, in two perpendicular directions defining a primary adjustment area parallel to the primary circuit surface whereby the primary-interfacing contacts may be precisely positioned relative to the primary-contacts.

The primary circuit surface includes a set of primary registrants which are precisely positioned relative to the set of primary contacts in a certain primary-registrant layout. The primary-interfacing section includes a set of primary-interfacing registrants which are sized and shaped to register with the primary registrants and which are precisely positioned relative to the primary-interfacing contacts in a certain layout corresponding to the primary layout whereby registration will result in the primary contacts being precisely aligned with the primary-interfacing contacts. The primary-positioner allows selective adjustment of the primary-interfacing registrants in the primary adjustment area whereby the primary-interfacing registrants may be adjusted relative to, and registered with, the primary registrants thereby precisely positioning the primary-interfacing contacts relative to the primary contacts.

These and other features of the invention are fully described and particularly pointed out in the claims. The following descriptive annexed drawings set forth in detail certain illustrative embodiments, however these embodiments are indicative of but a few of the various ways in which the principles of the invention may be employed.

BRIEF DESCRIPTION OF THE DRAWINGS

In the annexed Drawings:

FIGS. 4A1, 4A2, and 4A3 are schematic views of the relevant electrical connections between the connection device, the flexible circuit strip, the mother board, and the daughter card when the data processing system is in a standard correlation arrangement;

FIGS. 4B1, 4B2, and 4B3 are schematic views similar to FIGS. 4A1, 4A2, and 4A3 except that the components of the data processing system are shown in an arrangement which deviates from the standard correlation arrangement;

FIG. 5 is an exploded perspective view of the various components of the connection device;

DETAILED DESCRIPTION

Figure 1:
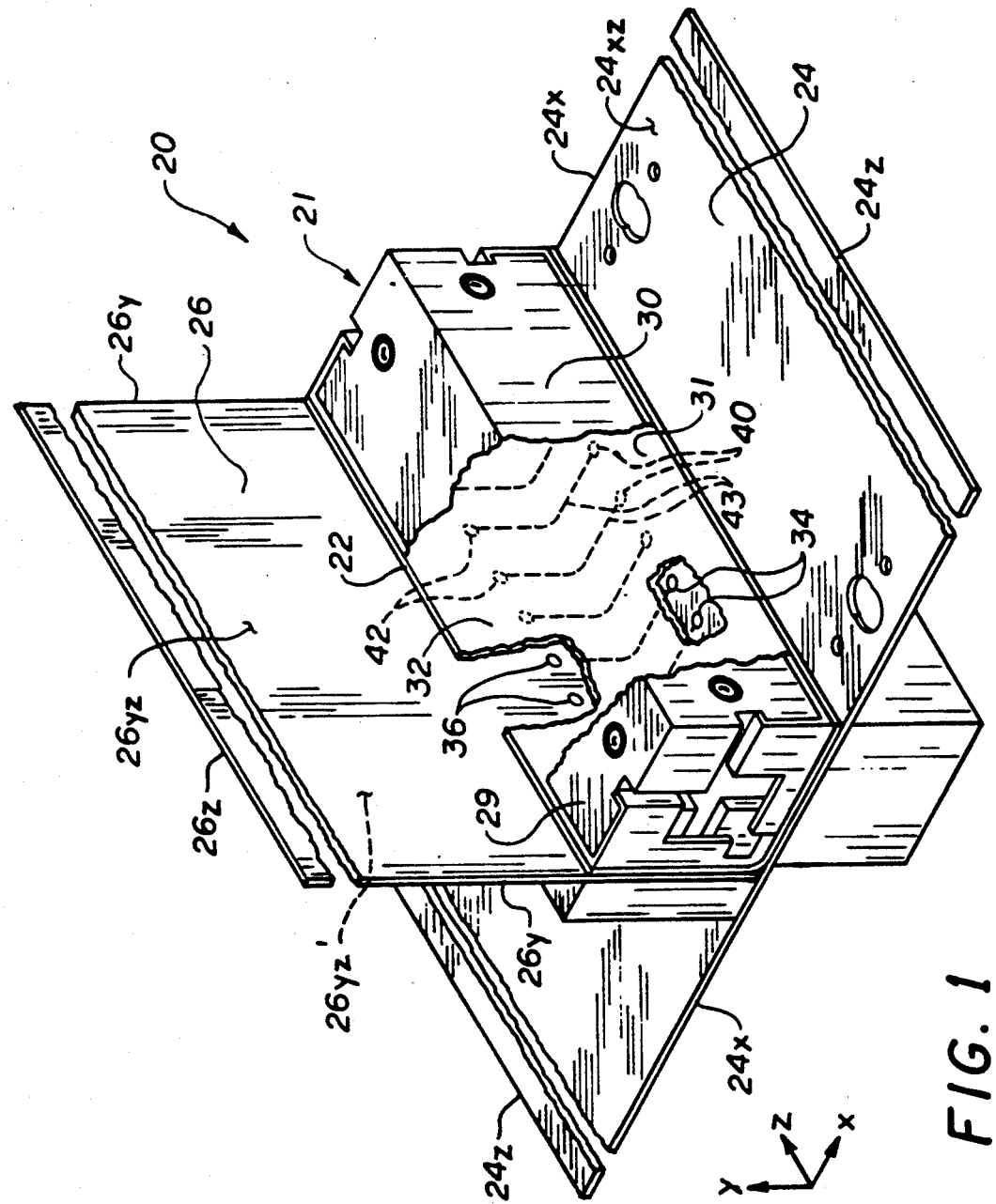
FIG. 1 is a perspective view of a data processing system which includes a mother board, a daughter card, a bi-directional adjustable connection device according to a first embodiment of the present invention, and a flexible circuit strip.

Before beginning a detailed description of the drawings, it may be noted as an introductory matter that the present invention particularly relates to a connection device which is designed to be incorporated into an electrical circuitry system. "Electrical circuitry system" in this context corresponds to any collection of electrical circuit components which, when connected together in an appropriate manner, will establish a desired electrical flow pattern. By way of example, an electrical circuitry system would typically be found in data processing equipment.

Several exemplary data processing systems, indicated generally as 20, 220, 320 and 520, are illustrated in the drawings and addressed in the following discussion. These electrical circuitry systems incorporate one of two embodiments of a connection device according to the present invention. More specifically, the electrical circuitry systems 20, 220 and 320, as shown, incorporate at least one connection device 21, and the electrical circuitry system 520 incorporates a connection device, or connection device/assembly, 521.

The connection devices 21 and 521 of the present invention are particularly designed to electrically couple a primary circuit surface to a companion circuit surface via a multi-section interfacing circuit surface. When these surfaces are electrically coupled in the proper manner, an electrical connection will be established between the primary circuit surface and the companion circuit surface. The connection devices 21 and 521 are designed so that they may be used with interfacing circuit surfaces having relatively short lead lengths resulting in high electrical performance and low cost. Additionally, they are adapted to allow for a reduction in tolerance buildup whereby a high interconnect density is possible. Still further, the connection devices 21 and 521 are designed so they are easy to install and replace in the field.

In the following discussion, specific components are assigned the role of the primary circuit surface, the companion circuit surface, and the interfacing circuit surface. These specific components, however, are merely for explanatory purposes and are not meant to limit the meaning of these terms. For example, the designation of one component as the "primary circuit surface" will usually be simply a conventional convenience rather than an indication that this component is fundamentally crucial to the circuitry system and that the component designated as the "companion circuit surface" merely performs a secondary purpose. Additionally, in the illustrated embodiments, the circuit surfaces are generally of a planar configuration, but these surfaces need not be of a planar geometry to fall within the scope of the invention. As a final note, reference x-y-z axes have been provided when helpful in the bottom left hand corner of the figures. These axes will be periodically referred to when addressing the orientation of the various components of an electrical circuitry system relative to each other. Thus, the terms x direction, y direction, and z direction correspond to the directional orientation of the x axis, the y axis, and the z axis, respectively. Additionally, the phrase x-y plane corresponds to the plane defined by the x axis and the y axis, the phrase x-z plane corresponds to the plane defined by the x axis and the z axis, and the phrase y-z plane corresponds to the plane defined by the y axis and the z axis. It should be understood, however, that the illustrated orientation of the components in the drawings is merely for explanatory purposes and other orientations are possible, and contemplated by, the present invention.

As was indicated above, the connection devices 21 and 521 are designed to be incorporated into an electrical circuitry system. Consequently, the connection devices will be addressed in this context in the succeeding discussion with each of the electrical circuitry systems being addressed in separate sections.

A. Electrical Circuitry System 20

Referring now to the drawings in detail, and initially to FIG. 1, an electrical circuitry system 20, which includes a connection device 21 according to the present invention, is shown. The electrical circuitry system 20, additionally includes a flexible circuit strip 22, a mother board 24, and a daughter card 26. The connection device 21 is designed to electrically couple the mother board 24, to the daughter card 26, via the flexible circuit strip 22. In this manner, the desired input/output electrical connection will be established between the mother board 24, and the daughter card 26.

The electrical circuitry system 20 is illustrated in FIG. 1 in a fully assembled form. As shown, the mother board 24, is rectangular in shape and is positioned in a generally horizontal plane which is parallel to the x-z plane. As such, the mother board 24, maybe viewed as having two parallel edges $24_x$ extending in the x direction, and two parallel edges $24_z$ extending in the z direction. These edges $24_x$ and $24_z$ together define a top side $24_{xz}$ and a bottom side (not specifically numbered) of the mother board 24.

The daughter card 26, which is also rectangular in shape, extends perpendicularly from the mother board 24, whereby it is positioned in a generally vertical plane parallel to the x-y plane. Consequently, it may be viewed as having two parallel edges $26_y$ extending in the y direction, and two parallel edges $26_z$ extending in the z direction. These edges $26_y$ and $26_z$ together define a front side $26_{yz}$ and a back side $26_{yz}'$ of the daughter card 26.

In this particular system, the top side $24_{xz}$ of the mother board 24 may be viewed as the primary circuit surface, the front side $26_{yz}$ of the daughter card 26 may be viewed as the companion circuit surface, and the flexible circuit strip 22 may be viewed as the multi-section interfacing circuit surface. However, as was previously noted, the illustrated orientation of these components is merely for explanatory purposes and other orientations are possible and contemplated by the present invention. For example, although the daughter card 26 is shown extending upwardly from the top side $24_{xz}$ of the mother board 24, in certain applications it may be necessary or desirable for the daughter card 26 to extend downwardly from the bottom side of the mother board 24.

In the illustrated orientation, the intersection of the top side $24_{xz}$ of the mother board 24 with the front side $26_{yz}$ and back side $26_{yz}$, of the daughter card 26 defines two 90° corners. When the electrical circuitry system 20, is in the fully assembled form, the connection device 21 will occupy one of these corners. In the system 20 shown in FIG. 1, the connection device 21 is shown positioned in the corner defined by the top side $24_{xz}$ of the mother board 24 and the front side $26_{yz}$ of the daughter card 26. As such, this corner may be referred to as the "connecting-corner" of the electrical circuitry system 20. However, the connection device 21 is designed so that it could alternatively, when placed in an opposite orientation, occupy the opposite corner defined by the top side $24_{xz}$ of the mother board 24 and the back side $26_{yz}'$ of the daughter card 26. This feature is advantageous in that it allows the connection device 21 to accommodate a variety of electrical circuitry systems and a wide range of applications.

The connection device 21 has a generally square cross-section in the x-y plane whereby it may fit tightly into the connecting-corner. The connection device 21 may be viewed as having a primary-coordinating side 27 which is adapted to be positioned parallel to the top side $24_{xz}$ of the mother board 24 and a companion-coordinating side 28 which is adapted to be positioned parallel to the front side $26_{yz}$ of the daughter card 26. When the system 20 is fully assembled, the primary-coordinating side 27 will be oriented in a plane parallel to the reference x-z plane and positioned adjacent to the mother board 24. Additionally, the adjoining companion-coordinating side 28 will be oriented in a plane parallel to the reference y-z plane and positioned adjacent to the front side $26_{yz}$ of the daughter card 26. The remaining two sides of the connection device, namely the top side 29 and the outer side 30, will be oriented parallel to the primary-coordinating side 27 and the companion-coordinating side 28, respectively.

As was indicated above, in the illustrated embodiment the flexible circuit strip 22 plays the role of the multi-section interfacing circuit surface. While other suitable components may be used in this capacity, it is important that the interfacing circuit surface have at least a primary-interfacing section and a companion-interfacing section. These sections must be joined together in such a manner that limited relative movement therebetween is possible without affecting the electrical integrity of the interfacing circuit surface.

The flexible circuit strip 22 allows the necessary degree of movement between the sections which is provided by its "bendable" nature. More particularly, the flexible circuit strip is preferably comprised of pliable substrate such as KAPTON TM polyamide film or TEFLON TM. Suitable flexible circuit strips are available in a variety of shapes and other features from Minco Products, Inc.

In the early stages of the assembly of the various components of the electrical circuitry system 20, the flexible circuit strip 22 is wrapped around and fixedly secured to the primary-coordinating side 27 and the companion-coordinating side 28 of the connection device 21. When wrapped in this manner, the flexible circuit strip 22 may be viewed as having a primary-interfacing section 31 positioned adjacent to the primary-coordinating side 27 of the device and a companion-interfacing section 32 positioned adjacent to the companion-coordinating side 28 of the device. The pliable nature of the strip 22 will result in it conforming to the shape of the connection device 21 whereby the sections 31 and 32 will be joined together at a substantially 90° junction.

When the assembly of the electrical circuitry system 20 is completed, the primary-interfacing section 31 of the strip 22 will be sandwiched between the primary-coordinating side 27 of the connection device 21 and the top side $24_{xz}$ of the mother board 24. Additionally, the companion-interfacing section 32 of the strip 22 will be sandwiched between the companion-coordinating side 28 of the connection device 21 and the front side $26_{yz}$ of the daughter card 26. Thus, the primary-interfacing section 31 is oriented in a plane parallel to the x-z plane and the companion-interfacing section 32 is oriented in a plane parallel to the y-z plane.

The electrical connection between the mother board 24 and the daughter card 26 is accomplished by the connection of input/output electrical contacts contained on the mother board 24, the daughter card 26, and the flexible circuit strip 22. More particularly, the top side $24_{xz}$ of the mother board 24 includes a plurality of electrical input/output board contacts 34 arranged in a certain pattern. Because in this particular electrical circuitry system 20, the top side $24_{xz}$ of the mother board 24 is the primary circuit surface, the board contacts 34 may be viewed as primary contacts arranged in a certain primary-contact pattern.

Although the primary-contact pattern shown in the drawings comprises, for simplicity's sake, a row oriented in the z direction, in a typical application such a pattern or "artwork", could, and probably would, be much more elaborate. Additionally, for ease in explanation, the density setting and size of these board contacts 34 are exaggerated in FIG. 1, and in other relevant drawings. However, in an actual embodiment, the board contacts 34 could be of very minute size and their density could be in the range of two hundred contacts per inch. It may be further noted at this point, that although the illustrated electrical circuitry system 20 includes only one daughter card 26, the mother board 24 could contain a series of patterns of board contacts 34 whereby it could accommodate several such cards.

The daughter card 26 also includes a plurality of electrical input/output card contacts 36 positioned along the bottom edge $26_z$ of the front side $26_{yz}$ of the card. Because the front side $26_{yz}$ of the card constitutes the companion circuit surface in the system 20, these card contacts 36 may be viewed as companion contacts arranged in a certain companion-contact pattern. In a typical application, each card contact 36 would be intended for electrical coupling with a corresponding board contact 34. For ease in explanation, the illustrated companion-contact pattern is in the form of a row of card contacts 36 oriented in the z direction, however more elaborate patterns are contemplated. As with the board contacts 34, the density setting and size of these card contacts 36, are overstated in the illustration for clarity.

The flexible circuit strip 22, includes a set of primary-interfacing electrical contacts 40 on the primary-interfacing section 31 and a set of companion-interfacing electrical contacts 42 on the companion-interfacing section 32. The primary-interfacing contacts 40 are arranged in a pattern corresponding to the primary-contact pattern, and the companion-interfacing contacts 42 are arranged in a pattern corresponding to the companion-contact pattern. As with the board contacts 34 and the card contacts 36, the density setting and size of the contacts 40 and 42 are exaggerated for the purposes of explanation.

The primary-interfacing contacts 40 are electrically connected to the companion-interfacing contacts 42 by a set of parallel electrical connection lines 43. Each of the connection lines 43 extends from a primary-interfacing contact 40, through the 90° junction, and terminates at a corresponding companion-interfacing contact 42. Thus, when the electrical circuitry system 20 is fully assembled, each connection line 43 will include a portion on the primary-interfacing section 31 of the strip 22 aligned in the x direction and a portion on the companion-interfacing section 32 of the strip 22 aligned in the y direction.

An electrical connection between the mother board 24 and the daughter card 26 is accomplished by mating a board or primary contact 34 with the corresponding primary-interfacing contact 40 and by mating the corresponding companion-interfacing contact 42 with the corresponding card or companion contact 36. In the illustrated embodiment, this would entail mating the first board contact 34 with the first primary-interfacing board contact 40, and mating the first companion-interfacing card contact 42 with the first card contact 36 whereby the first line 43 would provide an electrical connection between the first board contact and the first card contact. Additionally, the second board contact 34 would be mated with the second primary-interfacing contact 40, and the second companion-interfacing contact 42 would be mated with the second card contact 36, whereby the second line 43 would provide an electrical connection between the second board contact and the second card contact. When this electrical connection arrangement is accomplished for each array of corresponding electrical contacts, the desired electrical connection will be established between each board contact 34 and card contact 36.

Thus, to insure that the proper electrical connection is made between the mother board 24 and the daughter card 26, the proper alignment of the board contacts 34 relative to the primary-interfacing contacts 40, and the proper alignment of the card contacts 36 relative to the companion-interfacing contacts 42, is very important. The alignment features of each of the components of the electrical circuitry system 20 is discussed in the succeeding subsection, followed by an explanation of the features of the connection device 21 which make proper alignment possible and a detailed discussion of the assembly of the various components of the electrical circuitry system 20.

i. Alignment Features

Figure 2:
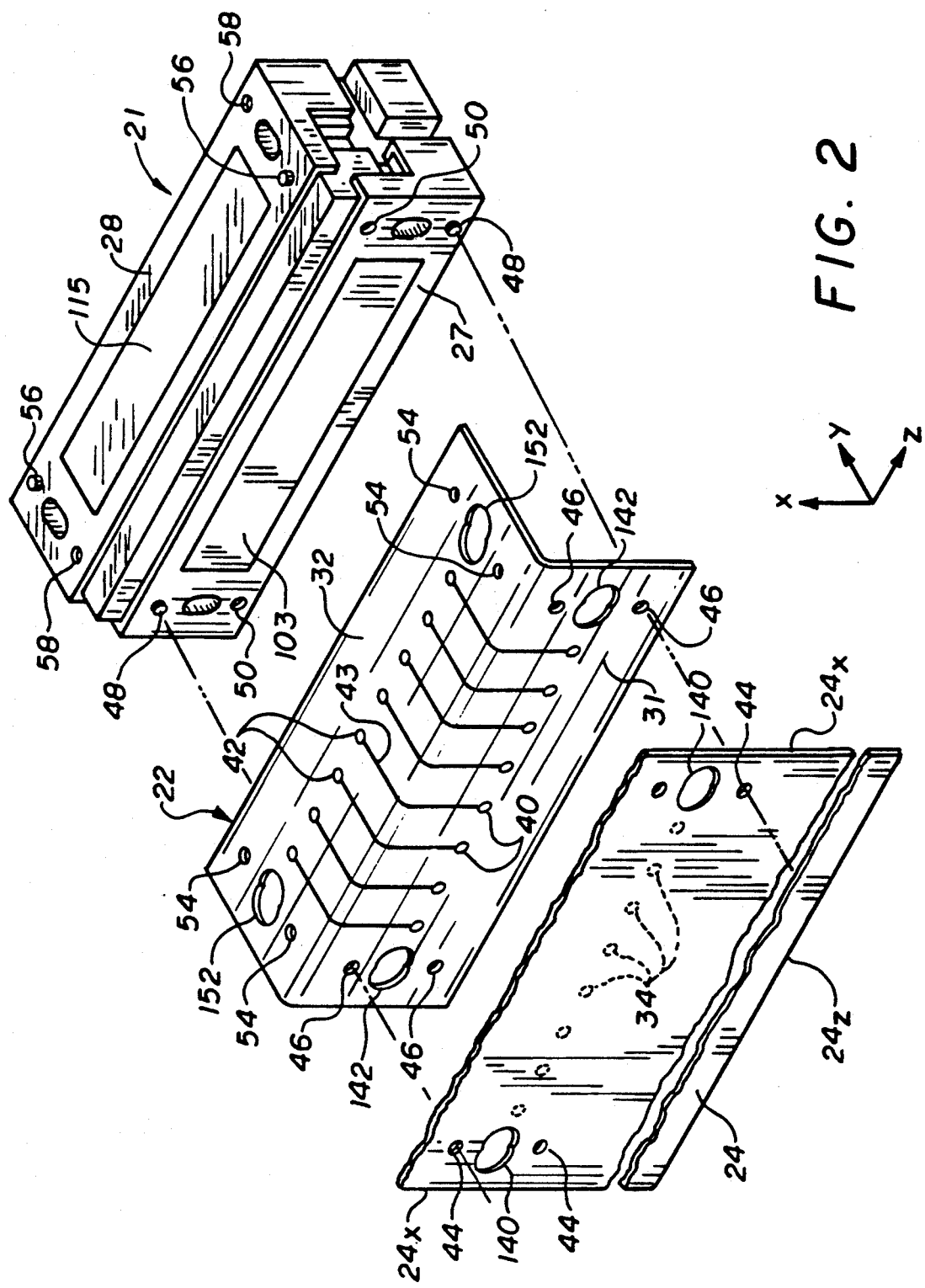
FIG. 2 is an exploded perspective view of the connection device, the flexible circuit strip, and the mother board.
Figure 3:
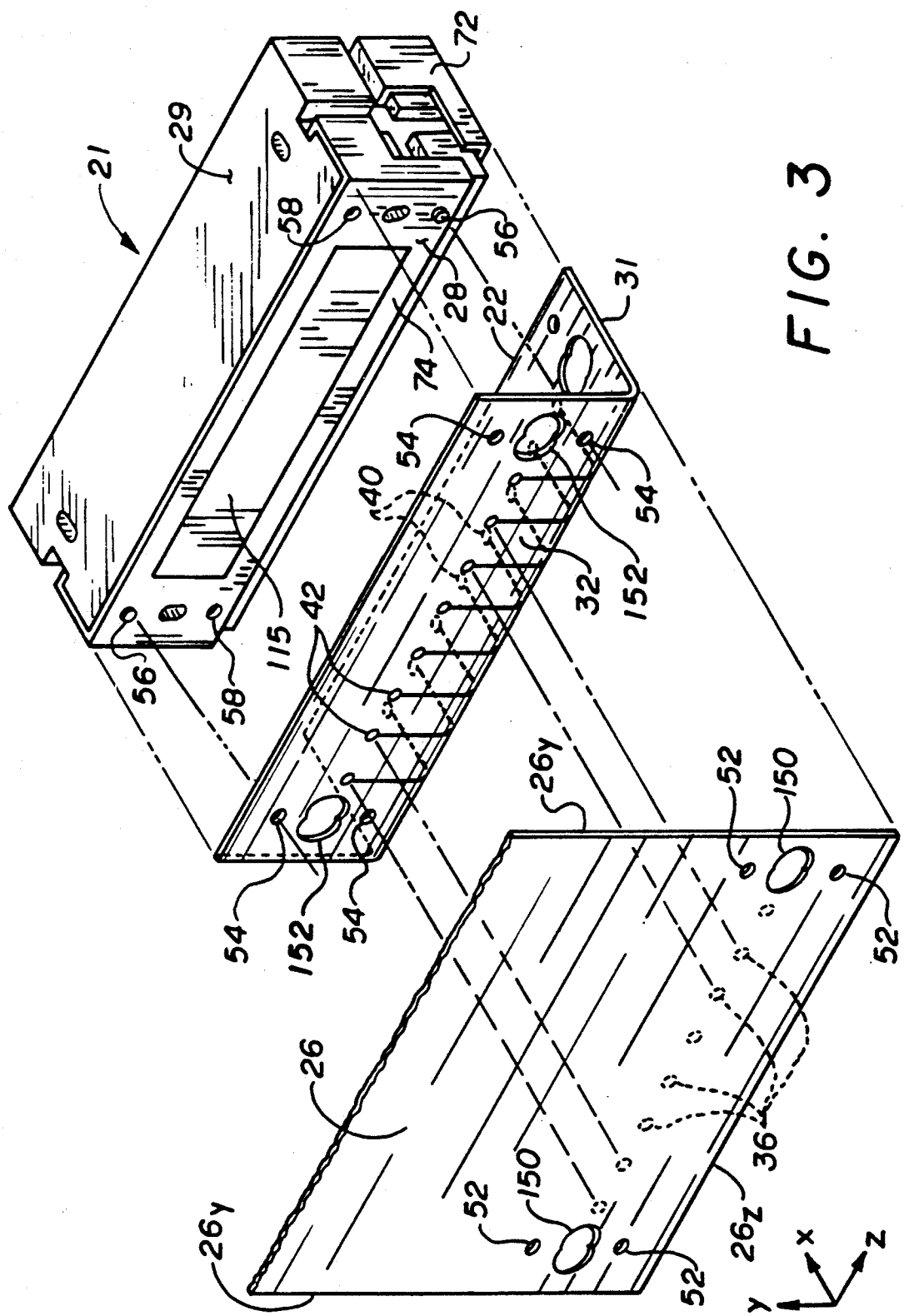
FIG. 3 is an exploded perspective view of the connection device, the flexible circuit strip, and the daughter card.

To accomplish the proper alignment between the mother board 24, the daughter card 26, the flexible circuit strip 22, and the connection device 21, these components all include coordinating alignment elements or registrants which are best shown in FIGS. 2 and 3. When the registrants are mated, or "registered", in the correct manner, the primary-interfacing contacts 40 will be precisely positioned relative to the board or primary contacts 34. Additionally, the companion-interfacing contacts 42 will be precisely positioned relative to the card, or companion, contacts 36.

As is best seen in FIG. 2, the "board-side" registrants particularly include circular registration openings 44 on the mother board 24, similar circular registration openings 46 on the primary-interfacing section 31 of the flexible circuit strip 22, and registration pins 48 on the primary-coordinating side 27 of the connection device 21. The connection device 21 further includes registration openings 50 on its primary-coordinating side which, as is explained in more detail below, may function as registrants in other systems. As is best seen in FIG. 3, the "card-side" alignment members particularly include circular registration openings 52 on the daughter card 26, essentially identical circular registration openings 54 on the companion-interfacing section 32 of the flexible circuit strip 22, and registration pins 56 on the companion-coordinating side 28 of the connection device 21. The connection device 21 further includes registration openings 58 on its companion-coordinating side which, like the registration openings 50, may function as registrants in other applications.

In the illustrated embodiment, two of the registration openings 44 are positioned at each end of the row of board contacts 34 on the mother board 24. (See FIG. 2) In the fabrication of the mother board 24, the registration openings 44 are precisely located in the x direction and the z direction relative to the primary-contact pattern of the board contacts 34. More particularly, each registration opening 44 is positioned an exact distance in the z direction from the respective end contact 34. Additionally, the two registration openings 44 positioned on each end of the row of contacts 34 will be offset a certain precise and opposite distance in the x direction from the row of board contacts 34. The registration openings 46 on the primary-interfacing section 31 of the flexible circuit strip 22 are arranged in a similar manner, and thus the four openings 46 are precisely located in the x direction and the z direction relative to the row of primary-interfacing contacts 40.

The registration openings 52 in the daughter card 26 are precisely located in the y direction and the z direction relative to the companion-contact pattern of card contacts 36. (See FIG. 3). In the illustrated embodiment, each registration opening 52 is positioned an exact distance in the z direction from the respective end contact 36. Additionally, the pair of registration openings 52 positioned on each end of the row of contacts 36 will be offset a certain precise, and opposite distance in the y direction from the row of card contacts 36. The registration openings 54 on the companion-interfacing section 32 of the flexible circuit strip 22 are arranged in a similar manner, and thus the four openings 54 are precisely located in the y direction and the z direction relative to the row of companion-interfacing contacts 42.

Regarding the registrants of the connection device 21, the registration pins 48 on the primary-coordinating side 27 of the connection device 21 are positioned and sized in such a manner that they may be tightly inserted in two of the registration openings 44 in the mother board 24 and two of the registration openings 46 in the flexible circuit strip 22. (See FIG. 2) These pins 48 are positioned at opposite ends of the primary-coordinating side 27 of the connection device 21, and the pins are offset, rather than aligned, in the x direction.

Similarly, the registration pins 56 on the companion-coordinating side 28 of the connection device 21 are positioned and sized in such a manner that they may be tightly inserted in two of the registration openings 52 in the daughter card 26 and two of the registration openings 54 in the companion-interfacing section 32 of the flexible circuit strip 22. (See FIG. 3) These pins 56 are positioned at opposite ends of the companion-coordinating side 28 of the connection device 21, and the pins are offset, rather than aligned, in the y direction.

To assemble the electrical circuitry system 20, the connection device 21 is coupled to the flexible circuit strip 22 by inserting each registration pin 48 on the primary-coordinating side 27 of the device through each corresponding registration opening 46 in the primary-interfacing section 31 of the strip, as is shown by the dashed lines in FIG. 2. Additionally, each registration pin 56 on the companion-coordinating side 28 of the connection device 21 is inserted through each corresponding registration opening 54 in the companion-interfacing section 32 of the flexible circuit strip 22, as is shown by the dashed lines in FIG. 3. In this manner, the flexible circuit strip 22 will be wrapped around and secured to the primary-coordinating side 27 and to the companion-coordinating side 28 of the connection device 21, as may be seen by briefly referring to FIG. 7. While it may not be particularly relevant to the assembly of the electrical circuitry system 20, it may be noted for future reference that the registration openings 50 and 58 on the connection device 21 are aligned with the unoccupied openings 46 and 54 of the flexible circuit strip 22.

Once the flexible circuit strip 22 has been wrapped around and secured to the connection device 21, the connection device may be coupled to the mother board 24 and the daughter card 26. Such a coupling will typically be accomplished by attaching the connection device 21 to the daughter card 26 by inserting the registration pins 56 through the corresponding registration openings 52 in the daughter card 26. The connection device 21 and the daughter card 26 now attached thereto, may then be coupled to the mother board 24 by inserting the registration pins 48 through the corresponding openings 44 in the mother board 24. Again, although it may not be particularly relevant to the assembly of the electrical circuitry system 20, it may be noted that the registration openings 50 and 58 on the connection device 21, and the unoccupied openings 46 and 54 of the flexible circuit strip 22, will be aligned with the unoccupied openings 44 and 52 on the mother board 24 and the daughter card 26, respectively.

Due to the precise positioning of the alignment members in relation to the respective electrical contacts, the above-described coupling process will accomplish the desired electrical connection between the mother board 24 and the daughter card 26. More particularly, each primary-interfacing contact 40 will be precisely aligned with the corresponding board contact 34 on the mother board 24 and each companion-interfacing contact 42 will be precisely aligned with the corresponding card contact 36 on the daughter card 26. Thus, the desired electrical connection will be obtained when the registrants of the various components are appropriately coordinated.

The connection device 21 of the present invention is consequently designed to allow the appropriate coordination of the registrants. In this regard, it is important to note that although the registrants are precisely located relative to the pertinent electrical contacts and the positioning of the registrants, the electrical contacts may not be precisely aligned relative to the overall geometry of the respective component. For example, the registrants on the mother board 24 and/or the daughter card 26 are usually not precisely positioned relative to the relevant edges of these components.

The relation of the overall geometry of the components to the electrical connection process is best explained by referring to FIGS. 4A1-4A3 and 4B1-4B3 which are schematic illustrations of the relevant electrical contacts of the connection device 21, the flexible circuit strip 22, the mother board 24, and the daughter card 26. In explaining these schematic illustrations, the designation of a reference point 60 is helpful. This reference point 60 corresponds to the intersecting point of the connecting-corner of the electrical circuitry system 20, and thus is indicative of the location at which the bottom edge 26z of the daughter card 26 is juxtaposed against the top side $24_{xz}$ of the mother board 24.

Examining initially FIGS. 4A1-4A3, these schematic illustrations depict what may be termed an ideal correlation arrangement between the components of the electrical circuitry system 20. In such an arrangement, the alignment members 44 of the mother board 24, and thus the board contacts 34, are precisely positioned in the z direction relative to both of the $24_x$ edges of the board and are precisely located in the x direction relative to the reference point 60. Additionally, the alignment members 52 of the daughter card 26, and thus the card contacts 36, are precisely positioned in the y direction relative to the bottom edge $26_z$ of the card and are precisely located in the z direction relative to both of the $26_y$ edges of the card.

Before addressing the positioning of the flexible circuit strip 22 in this standard arrangement, it is important to note that the flexible circuit strip 22 is wrapped around, and secured to, the connection device 21. Consequently, the positioning of the connection device 21 dictates the positioning of the flexible circuit strip 22. In this arrangement, the primary registrants 48 and 50 and the corresponding companion alignment members 56 and 58 is precisely positioned in a plane parallel to the reference x-y plane. Additionally, the distance in the x direction between the primary registrants 48 and 50 and the reference point 60 are precisely equal to the distance in the y direction between the card-side alignment members 56 and 58 and the reference point 60. In this manner, the proper electrical connection is made between the mother board 24 and the daughter card 26.

While the connection device 21 is designed to accommodate such an ideal arrangement, in actual practice, the mating of the various components of an electrical circuitry system would probably result in an arrangement which deviates somewhat from ideal. Consequently, the connection device 21 of the present invention is also designed to accommodate arrangements which deviate from the standard by allowing the appropriate adjustment or manipulation of the flexible circuit strip 22. In contrast to the rigid components of the electrical circuitry system 20, namely the mother board 24 and the daughter card 26, the flexible nature of the strip 22 allows such manipulation without affecting the integrity of its electrical contacts 40 and 42.

An illustrative derivation is shown in FIGS. 4B1-4B3 which include phantom lines to designate the positioning of the relevant electrical contacts in an ideal arrangement. In discussing such a deviation, it is important to note that, because of the precise positioning of the registrants relative to the contacts, the flexible circuit strip 22 will always be precisely aligned relative to the connection device 21. Additionally, once the appropriate coordination between the registrants has been achieved, the board contacts 34 and the primary-interfacing contacts 40 will be precisely aligned, and the card contacts 36 and the companion-interfacing contacts 42 will be precisely aligned. Thus, the adjustment capabilities of the connection device 21 relate to the manipulation of the flexible circuit strip 22 to allow the appropriate coordination of corresponding alignment members. After such coordination has been achieved, further manipulation of the flexible circuit strip 22 will usually be unnecessary, and preferably prohibited.

Referring now particularly to the arrangement shown in FIGS. 4B1-4B3, the alignment members 44 of the mother board 24, and thus the board contacts 34, are not precisely positioned in the z direction relative to both of the $24_x$ edges of the board and are not precisely located in the x direction relative to the reference point 60. Additionally, the alignment members 52 of the daughter card 26, and thus the card contacts 36, are not precisely positioned in the y direction relative to the bottom edge $26_z$ of the card and are not precisely located in the z direction relative to both of the $26_y$ edges of the card. Consequently, each board contact 34 is offset from the standard in the x and z direction by a differential of $\delta_{xb}$ and $\delta_{zb}$; and each card contact 36 is offset from the standard in the y and z direction by a differential of $\delta_{yc}$ and $\delta_{zc}$.

Thus, to accomplish the desired electrical connection in the derivative shown in FIGS. 4B1-4B3, each of the primary-interfacing contacts 40 would have to be adjusted in the x and z direction by a differential of $\delta_{xb}$ and $\delta_{zb}$. Additionally, each of the companion-interfacing contacts 42 would have to be adjusted in the y and z direction by a differential of $\delta_{yc}$ and $\delta_{zc}$. The particular design of the connection device 21 which allows such adjustments is discussed in detail in the following subsection.

ii. The Connection Device 21

The connection device 21 of the present invention is designed to allow bi-directional adjustments whereby adjustments may be made in a primary-adjustment area parallel to its primary-coordinating side 27 (and thus the reference x-z plane) and also in a companion-adjustment area parallel to its companion-coordinating side 28 (and thus the reference y-z plane).

The manner in which the connection device 21 accomplishes these bi-directional adjustments is best explained by referring additionally to FIG. 5 in which the various components of the for coordination with the primary-positioner 72, and a set of connection device 21 includes a modular support member which is indicated generally at 70, a modular primary-positioner which is indicated generally at 72, and a modular companion-positioner which is indicated generally at 74. These modular members, along with a primary-elastomeric band 75 and a companion-elastomeric band 76, are designed so that they may be coupled together in a modular manner to form the connection device 21.

The modular support member 70 includes a bar-shaped main body portion 80 having a length, or a z dimension, slightly less than the desired length of the connection device 21. The transverse geometry of the main body portion 80, is almost, but not quite square, and the x and y dimensions of this transverse shape are slightly less than the desired transverse shape of the assembled connection device 21. This particular configuration is chosen so that when the positioners 72 and 74 are modularly coupled to the support member 70, the resulting shape of the connection device 21 will be of the desired length and of the desired square transverse shape.

As indicated above, the components of the connection device 21 are designed so that they may be coupled together in a modular manner. To this end, support-couplers are provided on each longitudinal end of the main body portion 80. More particularly, the support member 70 includes a set of primary-support couplers in the form of a pair of tracks 82 extending in the x direction companion-support couplers in the form of a pair of tracks 84 companion-support couplers in the form of a pair of tracks 84 extending in the y direction for coordination with the companion-positioner 74. Thus the primary-support couplers comprise tracks 82 extending in a first track-direction and the companion-support couplers comprise tracks 84 extending in a second-track direction different from the first direction.

The tracks 82 and 84 are defined by four rectangular notches 86, 88, 90 and 92, the shape and positioning of which are best explained by referring to the drawings. However, it may be noted that because the tracks are not centrally arranged, the notches are not all of the same shape and size. Additionally, the notch 86 (in the upper right hand corner in FIG. 5) extends outwardly further in the z direction than the notches 88, 90 and 92.

Turning now to the primary-positioner 72, it includes a main body portion 100 and a set of primary-positioner couplers indicated generally at 102. The main body portion 100 is shaped essentially like an elongated rectangular plate and the coupling elements 102 extend perpendicularly from opposite longitudinal ends thereof. A rectangular window 103 is centrally located in the main body portion 100 of the primary-positioner 72 for coordination with the primary-elastomeric band 75. As is explained in more detail below, when the electrical circuitry system 20 is fully assembled, the primary-elastomeric band 75 will conspire with other components of the connection device 21 to insure that an electrical contact is made between the primary-interfacing contacts 40 on the flexible circuit strip 22 and the primary contacts 34 on the mother board 24.

The specific function of the primary-positioner couplers 102 is to coordinate with the tracks 82 on the modular support member 70 and to couple the primary-positioner 72 to the support member 70 in a modular fashion. As such, the primary-positioner couplers 102 are shaped and arranged to modularly mate with the primary-support couplers. More particularly, each coupler 102 includes a roughly L-shaped support base 104 comprised of a thin leg 106 extending along the edge of the main body portion 100 and a thicker leg 108 extending perpendicular and upward therefrom. A slide-lip 110 projects inward from the upper edge of the thicker leg 108 and is sized to be received in the first track 82 of the support member 70.

The companion-positioner 74 is essentially identical in configuration to the primary-positioner 72, and it includes a main body portion 112, a set of companion-positioner couplers 114 which extend perpendicularly therefrom, and a window 115 which is sized to accommodate the companion-elastomeric band 76. Each coupler 114 includes a L-shaped support base 116 having a thin leg 118 extending along the edge of the main body portion 112 and a thicker leg 120 extending in therefrom. A slide-lip 122 projects inward from the distal edge of the thicker leg 120 and is shaped and arranged to modularly mate with the support couplers 84 on the support member 70. Because the primary positioner 72 and the companion positioner 74 are essentially identical in configuration, they may be used interchangeably in the assembly of the connection device 21.

To assemble the various components of the connection device 21, the positioners 72 and 74 are coupled to the support member 70 in a modular fashion as is shown schematically by the dashed lines in FIG. 5. More specifically, the primary-elastomeric band 75 is placed in the window 103 of the primary-positioner 72 and the slide-lips 110 are inserted into the respective first tracks 82 of the modular support member 70, thereby coupling the primary-positioner 72 thereto. Likewise, the companion-elastomeric band 76 is placed in the window 115 of the companion-positioner 74 and the slide-lips 122 are inserted into the respective second tracks 84 of the modular support member 70. Thus the primary positioner 72 is coupled, albeit indirectly via the support member 70 to the companion positioner 74.

At this point it should be noted that the components of the connection device 21 are designed to securely couple the positioners 72 and 74 to the support member 70 while at the same time providing a predetermined z-slip-space therebetween. More particularly, the coupling elements 102/114 and the tracks 82/84 are dimensioned so that the positioner 72/74 cannot be uncoupled from the track-member except in the above-described sliding manner. However, the designed z-slip-space between the slide-lips 110/122 and the support member 70 is such that limited movement is possible in the z direction once the positioners 72/74 are coupled to the support member 70. As is explained in more detail below, this slip space allows the connection device 21 to make the necessary adjustments in the z direction to achieve proper alignment.

Figure 6:
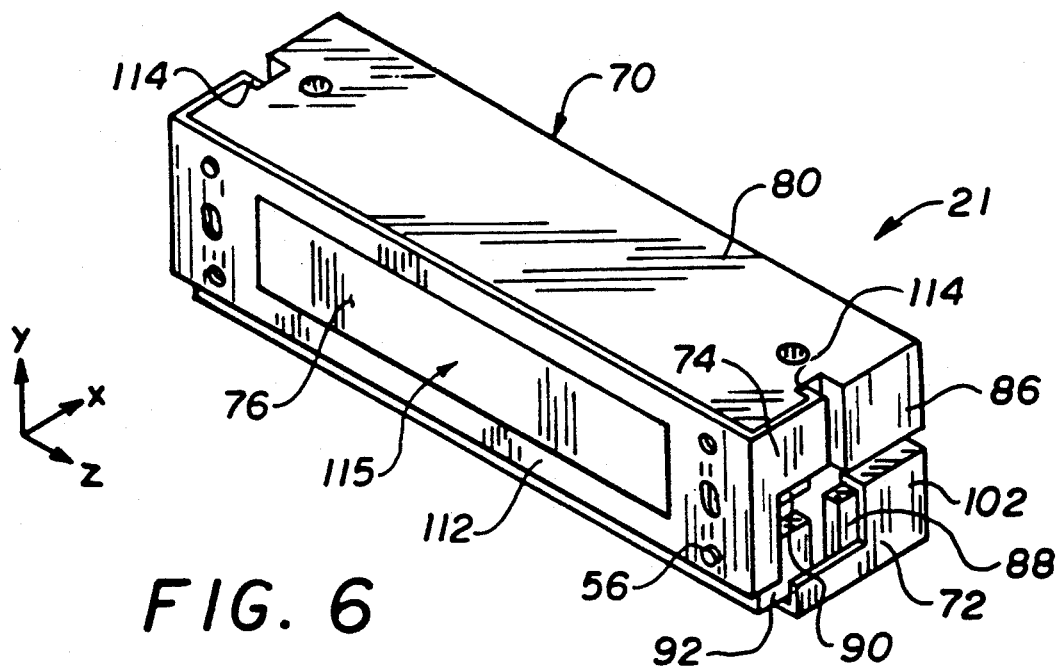
FIG. 6 is a perspective view of the connection device in an assembled condition.

When the components of the device 21 are modularly coupled together in this manner, the connection device 21 is transformed into the assembled condition illustrated in FIG. 6. In such a condition, the main body portion 100 of the primary-positioner 72 will be positioned below the lower surface of the modular support member 70, and the primary-positioner couplers 102 will be positioned at the longitudinal ends of the member 70. Additionally, the main body portion 112 of the companion-positioner 74 will be positioned adjacent the inner surface of the modular support member 70, and the companion-positioner couplers 114 will be positioned at the longitudinal ends of the member 70.

The components of the connection device 21 are designed so that when the primary-positioner 72 and the companion-positioner 74 are assembled on the modular support member 70, the connection device 21 will be of the desired geometry. More particularly, the thickness of the positioner couplers 102 and 114, (or their dimension in the z direction) is such that their outer surfaces will lie substantially flush with the respective raised notch 86 on the support member 70. Additionally, the device 21 is dimensioned so that the thickness of the main body portion 100 of the primary-positioner 72 (or its dimension in the y direction), and the thickness of the main body portion 112 of the companion-positioner 74 (or its dimension in the x direction), result in the device 21 having a square transverse shape.

In the assembled connection device 21, the primary-elastomeric band 75 will be sandwiched between the bottom surface of the support member 70 and the primary-positioner 72. Likewise, the companion-elastomeric band 76 will be sandwiched between the inner side surface of the support member 70 and the companion-positioner 74. The elastomeric bands 75 and 76 are preferably identical whereby they may be used interchangeably in the assembly of the connection device 21.

It may be noted at this point that the bands 75 and 76 include relatively thin border rims 123 and 124, respectively, for holding the bands in the desired position. The primary-elastomeric band 75 is sized so that all but its border rim 123 will be positioned within the window 103 of the primary positioner 72; the companion-elastomeric band 76 is sized so that all but its border rim 124 will be positioned within the window 115 of the companion positioner 74. In this manner, the rims 123 and 124 will be trapped between the positioners 72 and 74, respectively, and the support member 70. The thickness of the portion of the primary-elastomeric band 75 positioned in the window is preferably equal to the thickness of the main body portion 100 of the primary-positioner 72. Likewise, the thickness of the portion of the companion-elastomeric band 76 positioned in the window is preferably equal to the thickness of the main body portion 112 of the companion-positioner 74. As is explained in more detail in the succeeding subsection, this design allows the bands 75 and 76 to function as flatteners in the electrical circuitry system 20.

One may appreciate that when the connection device 21 is in such an assembled condition, the main body portion 100 of the primary-positioner 72 defines the primary-coordinating side 27 of the device 21, and the main body portion 112 of the companion-positioner 74 defines the companion-coordinating side 28 of the device 21. As such, the primary-positioner registrants 48 and 50 of the device 21 are located on the primary-positioner 72, while the companion-positioner registrants 56 and 58 of the device 21 are located on the companion-positioner 74. Regarding the connection-top side 29 and the connection-outer side 30, these sides are defined by the top and outer side surfaces, respectively, of the modular support member 70.

When the connection device 21 is positioned in the illustrated orientation, the distal ends of the thin legs 106 and 118 of the coupling elements 102 and 114, respectively, will meet in the lower left-hand corner of the device. However, this union is not a tight fit, rather the device 21 is strategically designed so that a certain x-y slip-space exists in this corner. As is explained in more detail below, this x-y slip space enables the primary positioner 72 to be adjusted in the x direction and the companion positioner 74 to be adjusted in the y direction.

Once the connection device 21 is in a constructed condition, it may be incorporated into the electrical circuitry system 20. As such, the modular construction of the connection device 21 may be viewed as a preparatory stage in the assembly of the electrical circuitry system 20. A detailed discussion of the preceding steps in this assembly process is set forth in the following subsection.

iii. Assembly of the Electrical Circuitry System 20

In the preferred assembly process, the flexible circuit strip 22 is initially secured to the fully constructed connection device 21. More particularly, the flexible circuit strip 22 is wrapped around, and attached to, the primary-coordinating side 27 and the companion-coordinating side 28 of the device. This attachment is accomplished by the correlation, or registration between the registrants 46 and 54 of the flexible circuit strip 22 and the registrants 48 and 56 of the connection device 21, respectively.

Figure 7:
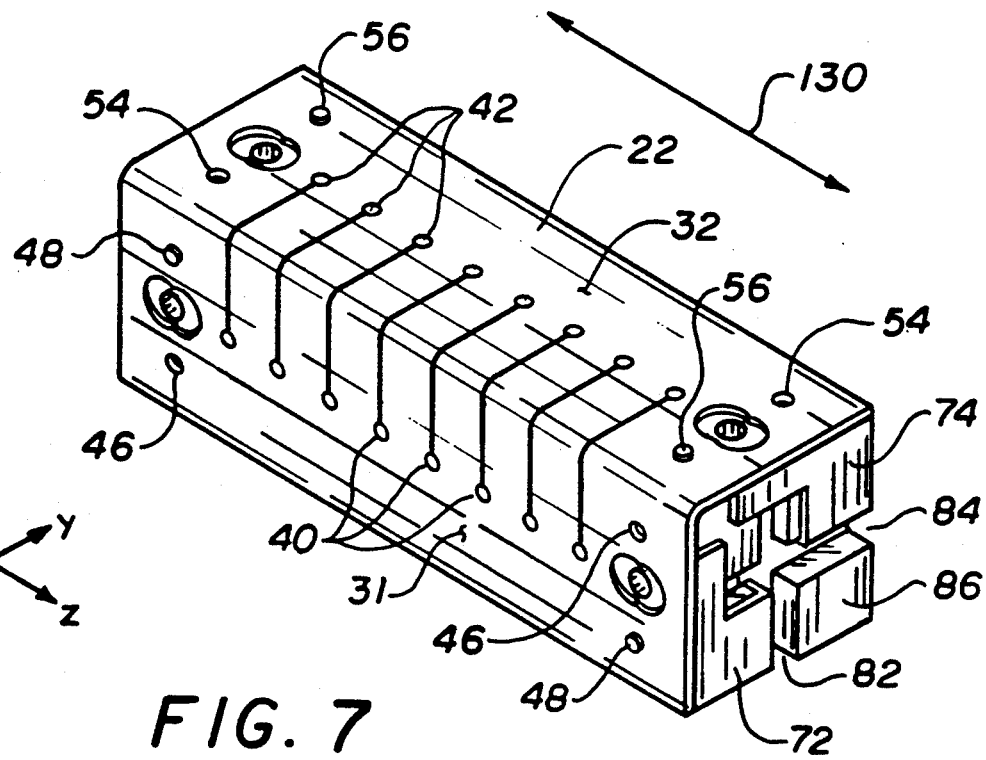
FIG. 7 is a perspective view of the connection device with the flexible circuit strip installed thereon; these components being shown in a position which is rotated 90° from their orientation in FIG. 1.
Figure 8:
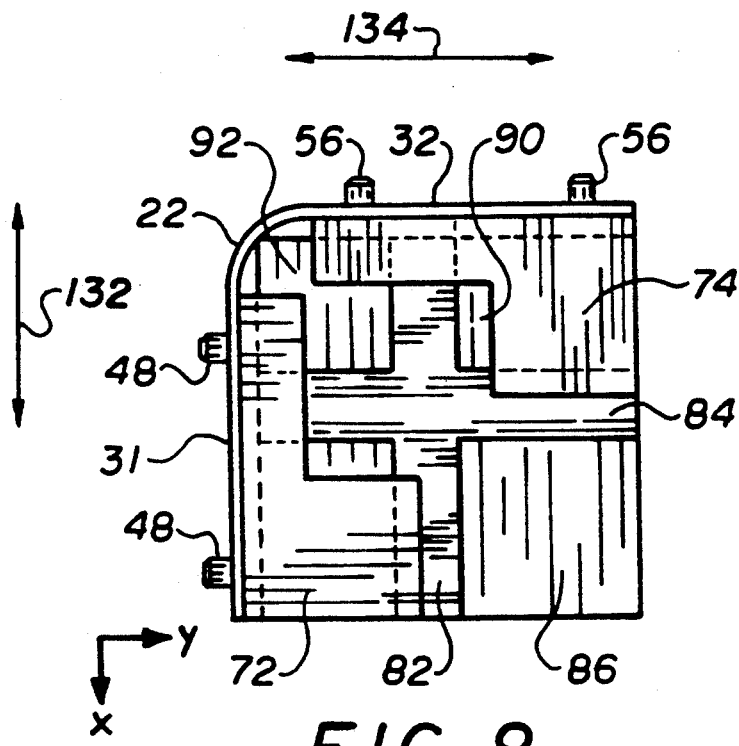
FIG. 8 is an end view of the connection device with the flexible circuit strip installed thereon in the orientation shown in FIG. 6.
Figure 9:
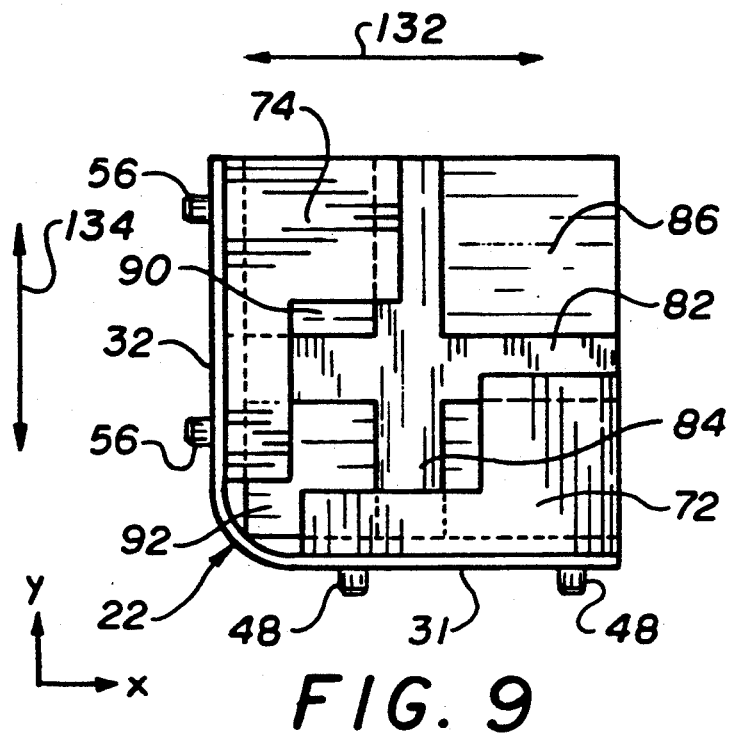
FIG. 9 is an end view of the connection device with the flexible circuit strip installed thereon shown in the orientation of FIG. 1.

The connection device 21, with the flexible circuit strip 22 attached thereto, is shown isolated from the other components of the electrical circuitry system 20 in FIGS. 7, 8 and 9. The orientation of the connection device 21 and the flexible circuit strip 22 in FIG. 9 is consistent with the earlier discussed drawings. However, in FIGS. 7 and 8, these components have been rotated, as reflected by the reference x-y-z axes, to more clearly show the attachment of the flexible circuit strip 22 to the connection device 21.

The bi-directional adjustments which are possible with the connection device 21 are schematically depicted by arrows 130, 132 and 134, in FIGS. 7, 8 and 9. For example, as is indicated by the arrow 130 in FIG. 7, the primary positioner 72, and thus the primary-coordinating side 27 of the connection device 21, may be moved in the z direction. This movement is possible due to the designed z-slip space between the coupling element 102 of the primary positioner 72 and the first track 82 of the modular support member 70. Additionally, as shown schematically by the arrows 132 in FIGS. 8 and 9, the primary positioner 72 may be slidably moved within the track 82 in the x direction and the x-y-slip space insures that "inward" movement is not unduly limited.

Comparable bi-directional movements are possible with the companion-positioner 74. More particularly, it, and thus the companion-coordinating side 28 of the device 21, may be moved in the z direction as shown schematically by the arrow 130 in FIG. 7. As with the primary-positioner 72, this movement is possible due to the designed z-slip-space between the couplers 114 and the second track 84. Additionally, as shown schematically by the arrows 134 in FIGS. 8 and 9, the companion-positioner 74 may be slidably moved within the second track 84 in the y direction whereby the x-y-slip space insures that such movement is not unduly limited.

Thus the primary-coordinating side 27 of the device 21, and the primary-interfacing section 31 of the strip 22 attached thereto, may be adjusted independently of the companion positioner 74, in both the x direction and the z direction. Additionally, the companion-coordinating side 28 of the device 21, and the companion-interfacing section 32 of the strip 22 attached thereto, may be adjusted, independently of the primary-positioner 72, in both the y direction and the z direction. In this manner, by way of example, the primary-coordinating side 27 of the device 21 may be adjusted in the x and z direction by a differential of $\delta_{xb}$ and $\delta_{zb}$; the companion-coordinating side 28 of the device 21 may be adjusted in the y and z direction by a differential of $\delta_{yc}$ and $\delta_{zc}$ to accommodate the arrangement shown in FIGS. 4B1–4B3.

The ability of the connection device 21 and the flexible circuit strip 22 attached thereto to adjust bi-directionally is important during the "coupling" stages of the assembly process of the electrical circuitry system 20.

In this assembly stage, the connection device 21 and the flexible circuit strip 22 are registered with and mounted to the mother board 24 and the daughter card 26. The bi-directional adjustment capabilities of the connection device 21 allow the flexible circuit strip 22 attached thereto to be manipulated, or adjusted to accomplish the registration phase of this assembly stage.

Once the registration phase has been completed for each corresponding array of registrants, the respective components will be coupled together, or mounted in place in the electrical circuitry system 20. Although the mounting procedure is discussed in more detail below, it is helpful at this point to refer briefly back to FIG. 2 and note that the mother board 24 includes mounting openings 140 located between the registration openings 44. These openings 140 are preferably of an elongated (in the z direction) shape rather than of a circular geometry. The primary-interfacing section 31 of the flexible circuit strip 22 includes mounting openings 142 which are essentially identical to the mounting openings 140.

The connection device 21 also includes mounting openings which coordinate with the mounting openings 140 and 142 in the coupling process. These mounting openings are best seen by referring briefly back to FIG. 5 and, as shown, comprise a pair of mounting openings 144 in the primary-positioner 72 and a pair of mounting openings 146 in the modular support member 70. While the mounting openings 144 in the primary-positioner 72 are of generally elongated shape, the openings 146 in the modular support member 70 are of a circular geometry.

The card-side, or companion components of the electrical circuitry system 20, include analogous mounting openings as is shown in FIGS. 3 and 5. These openings include mounting openings 150 in the daughter card 26, mounting openings 152 in the companion-interfacing section 32 of the flexible circuit strip 22, mounting openings 154 in the companion-positioner 74, and mounting openings 156 in the support member 70.

Turning now to the registration/mounting procedure, it may be viewed as being accomplished in a two step manner. As was briefly explained above, the first step of this procedure entails registering and mounting the connection device 21 and the flexible circuit strip 22 to the daughter card 26. The second step entails registering and mounting the connection device 21 and the flexible circuit strip 22 (with the daughter card 26 mounted thereto) to the mother board 24.

Regarding the card, or companion registration/mounting step, it involves inserting the registration pins 56 (which, as previously noted, extend beyond the flexible circuit strip 22) through the corresponding registration openings 52 in the daughter card 26. The connection device 21, or more specifically the companion positioner 74, may be adjusted in the y direction and the z direction as necessary to accomplish this insertion. Once this registration is complete, the companion-interfacing contacts 42 on the flexible circuit strip 22 will be precisely aligned with the card contacts 36 on the card. As such, the connection device 21 may be securely mounted in this precisely aligned position to the daughter card 26.

Figure 10:
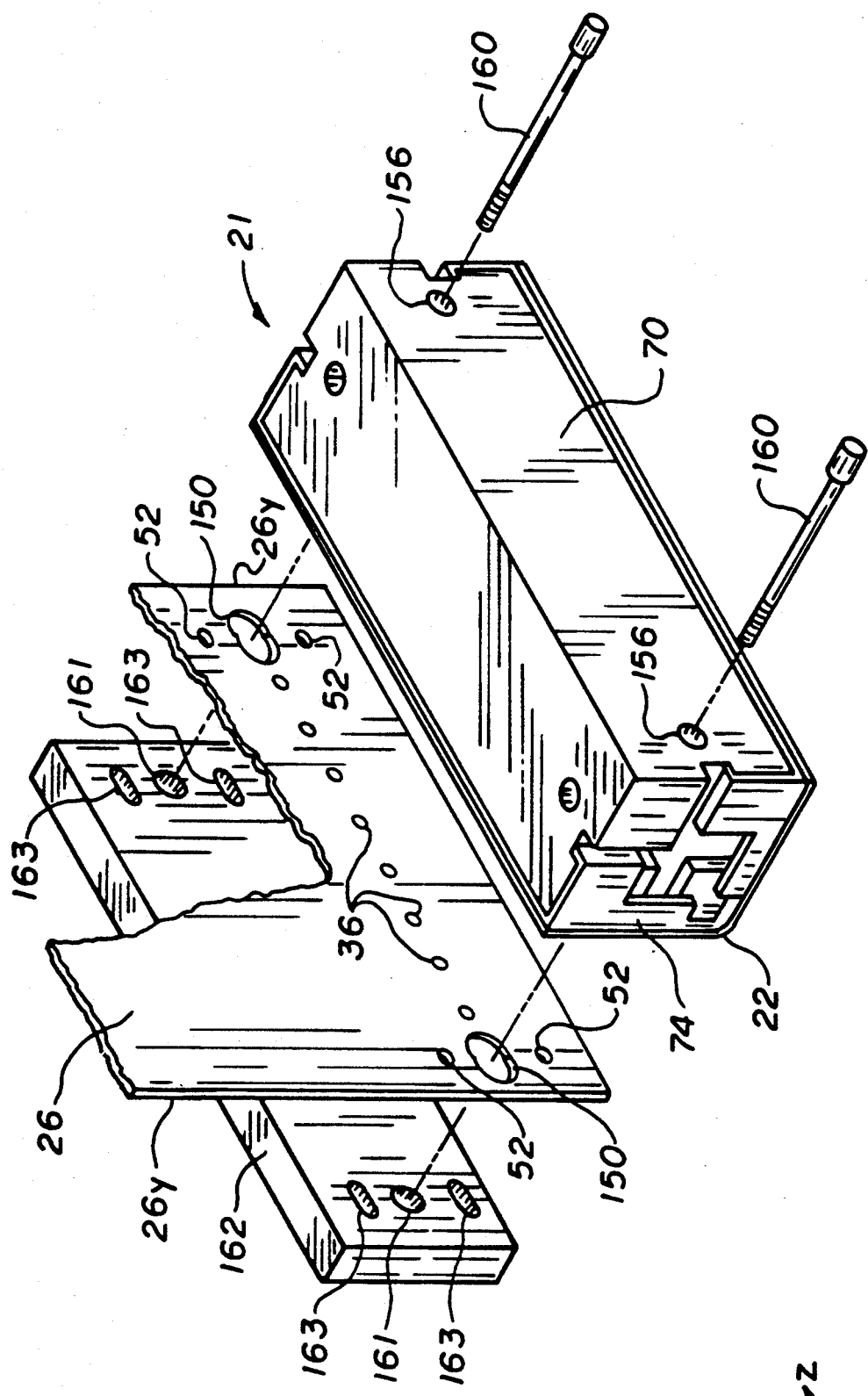
FIG. 10 is a perspective exploded view of the daughter card, the connection device with the flexible circuit strip installed thereon, and certain card-side mounting components.
Figure 11:
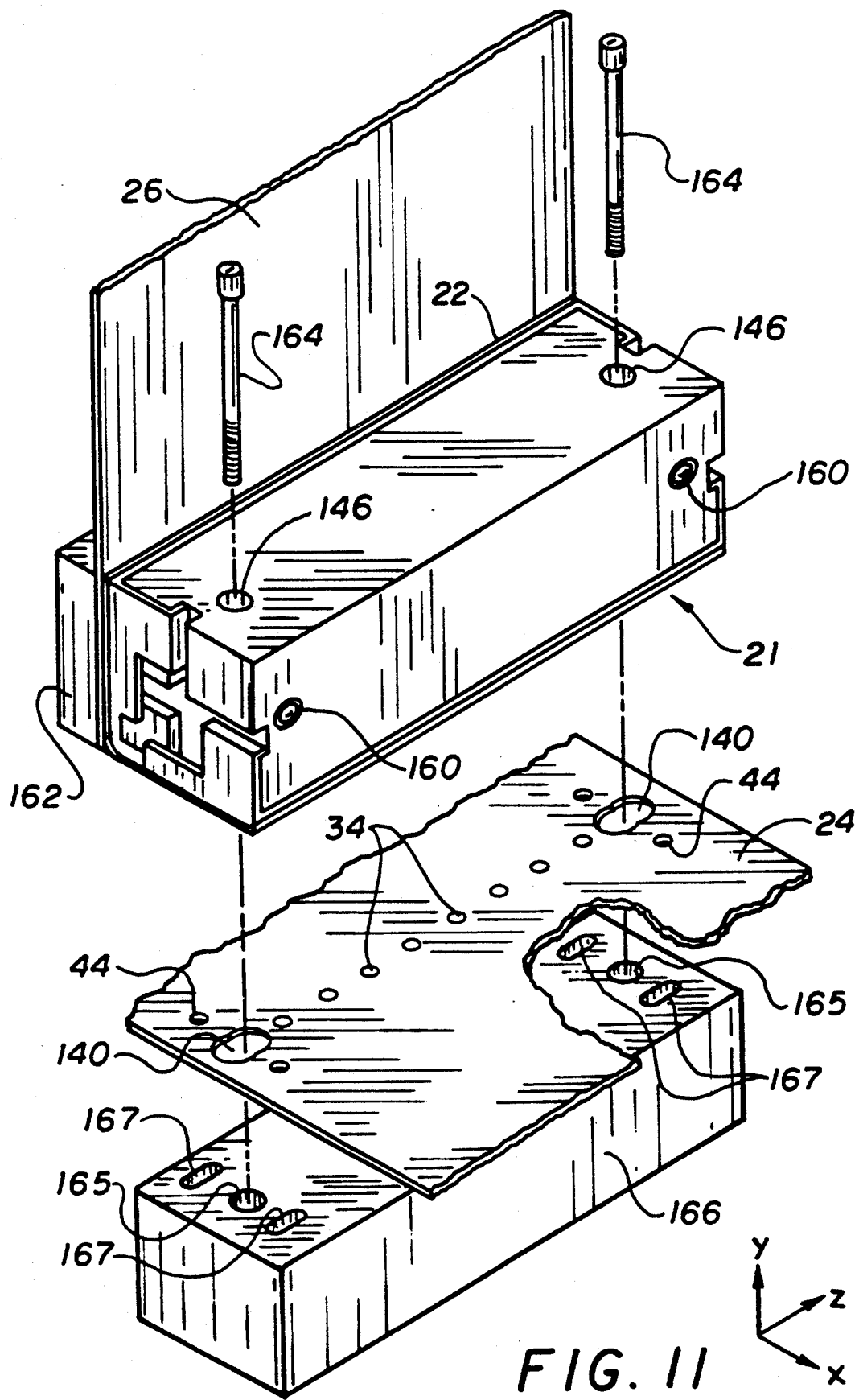
FIG. 11 is a perspective exploded view of the mother board, the connection device with the flexible circuit strip and daughter card installed thereon, and certain board-side mounting components.

As is best shown in FIG. 10, the mounting of the precisely aligned connection device 21 and flexible circuit strip 22 is accomplished by inserting a pair of mounting fasteners 160 through the generally aligned "card-side" mounting openings in the connection device 21, the flexible circuit strip 22, and the daughter card 26. The mounting fasteners 160 and the connection device 21 are designed so that the fastener heads (not specifically numbered) will lie flat against the outer side 30 of the connection device 21. Additionally, the fastener shafts (not specifically numbered) are dimensioned so that they will extend beyond the daughter card 26 and may be inserted within the mounting openings 161 on a card mounting back-up plate 162. The mounting openings 161 on the back-up plate 162 are designed so that the fasteners 160 will be received in such a manner that they will be locked in the mounting position. Additionally, the back-up plate 162 includes elongated slots 163 on either side of the mounting openings 161 to accommodate the registration pins 56. The slots 163 are not sized to tightly receive the pins 56, but rather to merely accommodate their extension beyond the daughter card 26.

Once the fasteners 160 have been locked in the mounting position, the daughter card 26 will be locked in a certain position relative to the card-side components of the flexible circuit strip 22 and the connection device 21. More particularly, the fasteners 160 extend through both the support member 70 and the companion positioner 74, and thus further movement between these components will be prevented. This prevention is desired because in this "locked position" the card-side registrants are properly coordinated, and the relevant contacts are appropriately aligned.

The connection device 21, and the daughter card 26 now attached thereto, may then be registered with, and mounted to, the mother board 24. This second phase of the registration/mounting process initially involves inserting the registration pins 48 through the corresponding registration openings 44 in the mother board 24. Note that although the companion-positioner 74 and the support member 70 may be locked in place relative to the daughter card 26, the primary-positioner 72 may still be adjusted relative to these components. Thus, the connection device 21 may be adjusted in the x direction and the z direction as necessary to coordinate the board-side, or primary, registrants 44 and 48.

Once the board-side registrants have been properly coordinated, the primary-interfacing contacts 40 on the flexible circuit strip 22 will be precisely aligned with the board contacts 34. The connection device 21 may then be securely mounted in this precisely aligned position to the mother board 24. This mounting is accomplished by mounting fasteners 164 which are essentially identical to the fasteners 160. The mounting fasteners 164 are adapted to be inserted within the mounting openings 165 on a board mounting back-up plate 166, whereby they will locked in this mounting position and the assembly of the electrical circuitry system 20 will be complete. The back-up plate 166 includes elongated slots 167 of a similar size, and for the same purpose, as the elongated slots 163.

Thus, once the second phase of the registration/mounting procedure has been completed, the primary-interfacing contacts 40 will be precisely aligned in the x direction and the z direction relative to the board, or primary contacts 34. Additionally, the companion-interfacing contacts 42 will be precisely aligned in the y direction and the z direction relative to the card, or companion contacts 36. The desired electrical connection between the components will thus be accomplished, assuming the positioning of the contacts 34 and 40 is proper in the y direction, and assuming the positioning of the contacts 36 and 42 is proper in the x direction.

To ensure that the positioning of the board, or primary contacts 34 and the primary-interfacing contacts 40 is proper in the y direction, the primary-elastomeric band 75 coordinates with other components in the electrical circuitry system 20 to create an elastomeric primary flattener. In the fully assembled system, the primary-flattener will create a primary flattening force which is independent of the mounting forces used to "lock" the connection device 21 to the mother board 24.

The primary flattening force is created because the primary-elastomeric band 75 is sandwiched between the support member 70 and the primary-positioner 72. The support member 70 functions as a "pressure bar" and compresses the primary-elastomeric band 75 to a fixed height equal to the thickness of the main body portion 100 of the primary positioner 72. This primary flattening force is in the y direction which is substantially perpendicular to the primary adjustment area (which is parallel to the x-z plane) and outward from the primary-coordinating side 27 of the connection device 21.

The primary flattening force will urge the primary-interfacing section 31 of the flexible circuit strip 22 toward the top side $24_{xz}$ of the mother board 24, encouraging physical interaction between the board contacts 34 and the primary-interfacing contacts 40. For this reason, the primary elastomeric band 75 and the window 103, are sized so that the flattening force will be evenly applied on an area which generously surrounds all of the primary-interfacing contacts 40 on the flexible circuit strip 22. Additionally, in the event that the top side $24_{xz}$ of the mother board 24 is less than perfectly planar, the force will encourage it to conform to the flatness of the back-up plate 166 and the connection device 21. It may also be noted that this force arrangement results in the "self-correcting" of any tolerance problems in the y direction between the primary-positioner 72 and the support member 70.

Similarly, to ensure that the positioning of the contacts 36 and 42 is proper in the x direction, the companion-elastomeric band 76 coordinates with other components in the electrical circuitry system 20 to create an elastomeric companion flattener. The elastomeric companion flattener is designed so that, in the fully assembled system, it will apply a companion flattening force on the relevant components. This companion flattening force will be independent of the mounting forces used to "lock" the connection device 21 to the daughter card 26.

The companion flattening force is produced by the sandwiching of the companion-elastomeric band 76 between the support member 70 and the companion-positioner 74. This companion flattening force is in the x direction which is substantially perpendicular to the companion adjustment area (which is parallel to the y-z plane) and outwardly from the companion-coordinating side 28 of the connection device 21. This force will urge the companion-interfacing section 32 of the flexible circuit strip 22 towards the front surface $26_{yz}$ of the daughter card 26 and/or encourage it to conform to the flatness of the back-up plate 162 and the connection device 21. As such, the companion-elastomeric band 76 and the window 115, are sized so that the flattening force will be evenly applied on an area which generously surrounds all of the companion-interfacing contacts 42 on the flexible circuit strip 22. Once again, this force arrangement will tend to "self correct" any tolerance problems in the x direction between the companion-positioner 74 and the support member 70.

One may now appreciate that the electrical circuitry system 20 comprises a primary-circuit surface $24_{xz}$, a companion circuit surface $26_{yz}$, an interfacing-circuit surface 22, and a connection device 21 which electrically couples the primary circuit surface $24_{xz}$ to the companion circuit surface $26_{yz}$ via the interfacing-circuit surface 22. While in this particular electrical circuitry system 20, the companion circuit surface $26_{yz1}$ comprises the front side $26_{yz}$ of the daughter card 26, as was explained above, the connection device 21 is also designed so that the companion-circuit surface could alternatively comprise the back side $26_{yz}$ of the daughter card 26. In either case, an electrical connection would be made between only one companion-circuit surface $26_{yz1}$ and such an arrangement may be conveniently called a "single-side" connection. However, as is explained below in reference to electrical circuitry systems 220 and 320, the connection device 21 is also designed so that a pair of the devices could accommodate a "dual-side" connection in which two companion circuit surfaces are electrically coupled to a primary circuit surface.

Electrical Circuitry System 220

Figure 12A:
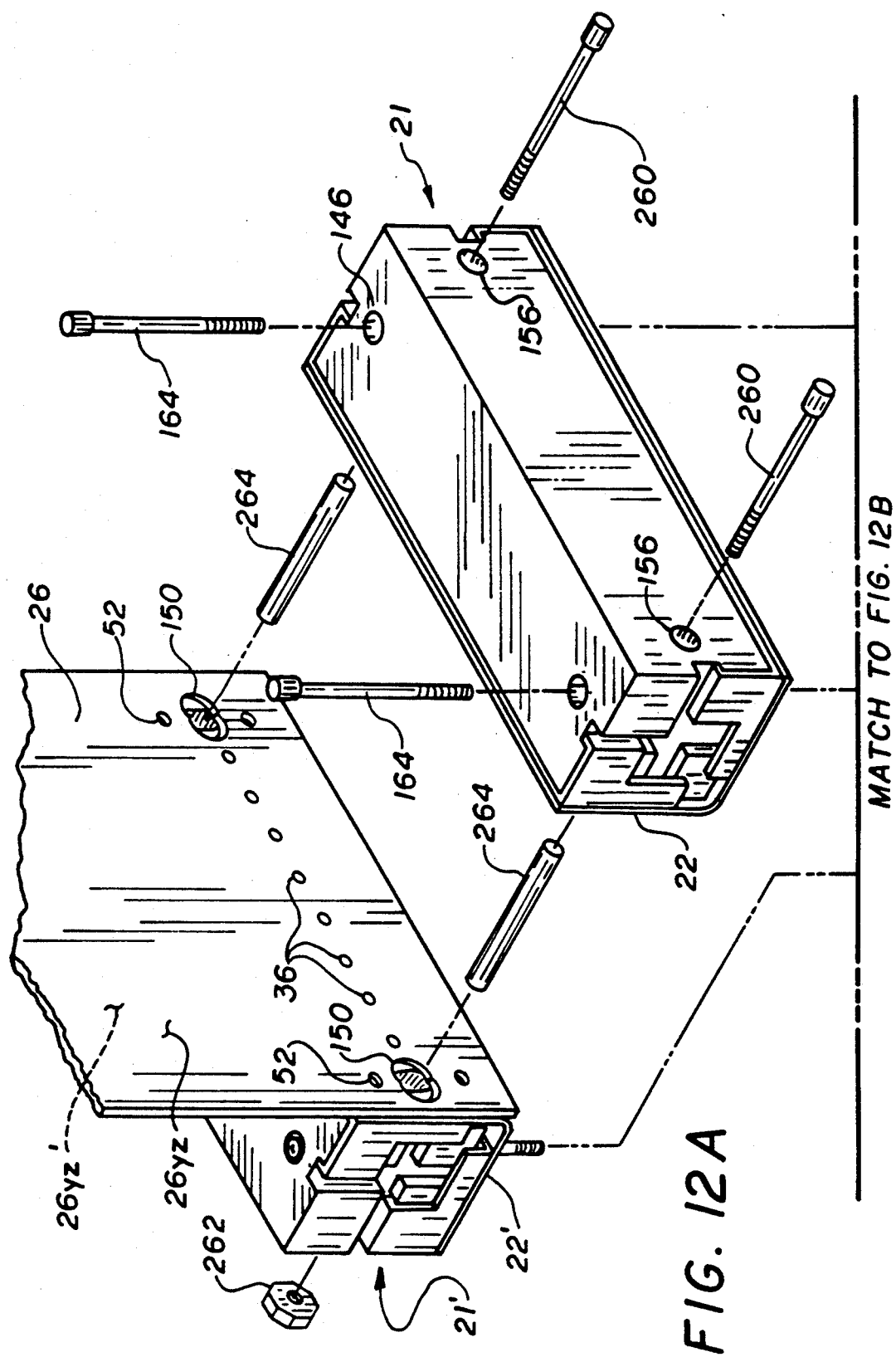
FIGS. 12A and 12B collectively form a perspective exploded view of another data processing system which includes a mother board, a daughter card, two connection devices according to the first embodiment of the invention, and two flexible circuit strips.
Figure 12B:
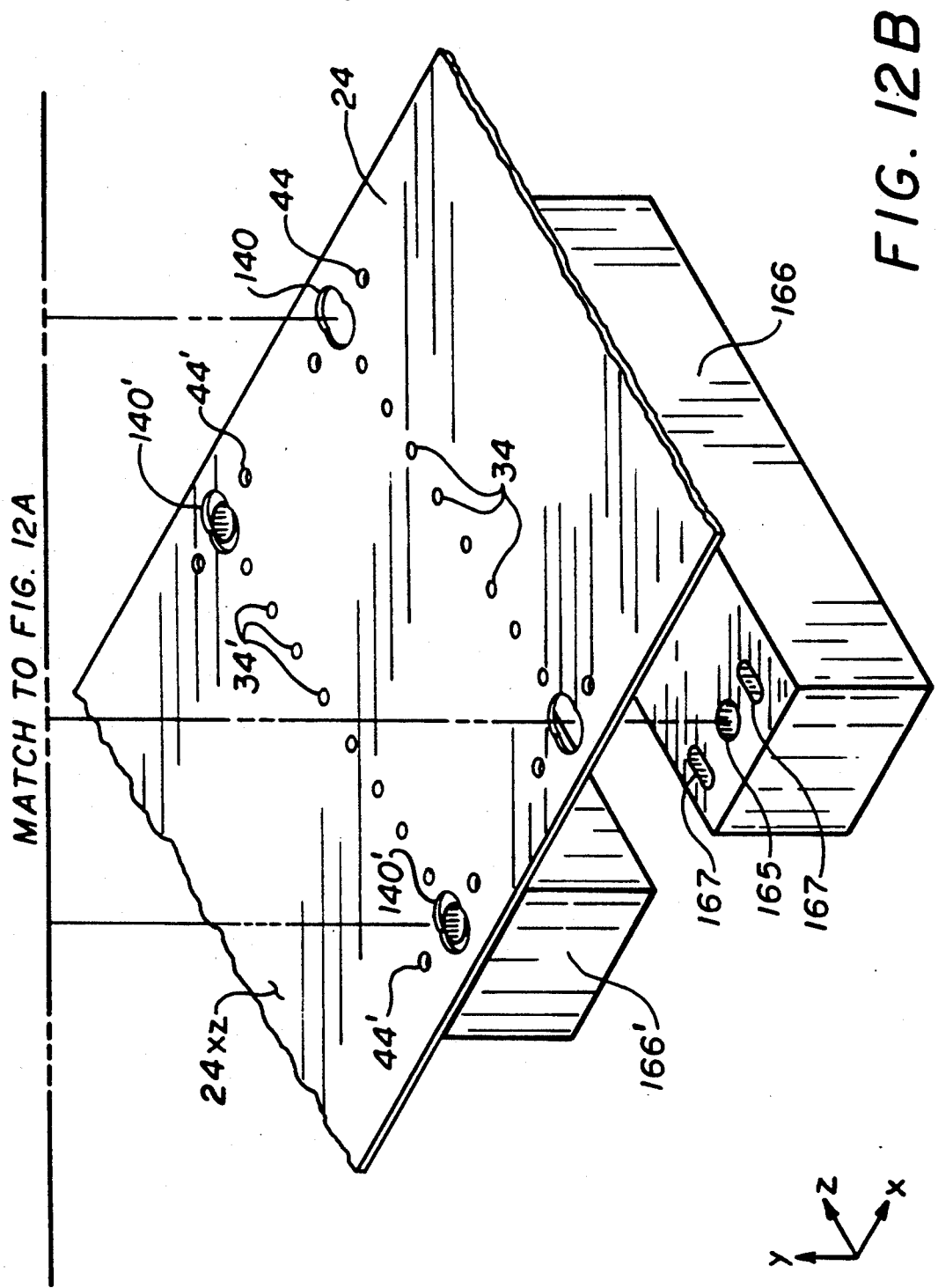

An electrical circuitry system 220 having a typical "dual side" connection arrangement is illustrated in FIGS. 12A and 12B. In this arrangement, the top side $24_{xz}$ of the mother board 24 constitutes the primary circuit surface, the front side $26_{yz}$ of the daughter card 26 constitutes one companion circuit surface, and the back side $26_{yz}'$ of the daughter card 26 constitutes another companion circuit surface. When the system 220 is fully assembled, the connection device 21 electrically couples the companion circuit surface $26_{yz}$ to the primary circuit surface $24_{xz}$, while a second, identical, connection device 21' couples the companion circuit surface $26_{yz}'$ to the primary circuit surface $24_{xz}$.

In the electrical circuitry system 220 as with the electrical circuitry system 20, the mother board 24 and the daughter card 26 define two opposite 90° corners when the system is in an assembled condition. While in a single-sided connection arrangement only one of these corners will be the "connecting corner", in a dual-side connection arrangement both of the corners will be connecting corners. Thus, the connection device 21 will occupy the front connecting corner and the connection device 21' will occupy the back connecting corner. These connection devices 21 and 21' are essentially identical in configuration, and in the assembled electrical circuitry system 220, are oriented oppositely (but not symmetrically) relative to the daughter card 26.

The electrical circuitry system 220 includes most, but not all, of the components which comprise the single-sided electrical circuitry system 20. Additionally, because the system 220 is of a dual-side arrangement, it also includes duplicates of certain components. As such, in the following discussion, like components will be designated by like reference numerals with the "back side", duplicate components including a prime (') suffix. The same convention was followed in the earlier assignment of reference numerals $26_{yz}$ and $26_{yz}'$ to the sides of the daughter card 26, and also in the assignment in the previous paragraph of reference numeral 21' to the duplicate back-side connection device.

In the electrical circuitry system 220, the daughter card 26 includes electrical card, or companion contacts 36 on its front side $26_{yz}$ and electrical card, or companion contacts 36' (not specifically shown) on its back side $26_{yz}'$. The contacts 36/36' will be precisely positioned relative to the registration openings 52. Additionally, because the front side $26_{yz}$ and the back side $26_{yz}'$ of the card essentially share these registrants, the front card contacts 36 will be precisely aligned with the back card contacts 36'. However, as discussed above in reference to the electrical circuitry system 20, the contacts 36/36' may not be precisely aligned relative to the overall geometry of the daughter card 26.

The mother board 24 includes board, or primary, contacts 34 and 34' which, in the illustrated embodiment, are arranged in two parallel rows in the z direction. The row of contacts 34 are intended for electrical connection with the front card contacts 36 and are precisely positioned relative to the registrants 44. The other row of board contacts 34' are intended for electrical connection with the back card contacts 36' and are precisely positioned relative to the registration openings 44'.

In contrast to the card-contacts 36 and 36', the primary contacts 34 and 34' do not share registration members. As such, the board contacts 34 will not necessarily be precisely aligned relative to the board contacts 34'. Moreover, the contacts 34/34' may not be precisely aligned relative to the overall geometry of the mother board 24.

In the preferred assembly process, the flexible circuit strip 22 is initially secured to the connection device 21 by wrapping it therearound, and attaching it thereto. The flexible circuit strip 22' is likewise secured to the connection device 21' in the same manner. When these initial steps of the assembly process are completed, each of the connection devices 21 and 21', and the flexible circuit strips 22 and 22', respectively, attached thereto, will be capable of bi-directional adjustments.

The connection devices 21 and 21' may then be coupled to the other components of the electrical circuitry system 220. As is shown in FIGS. 12A and 12B, this coupling is accomplished by positioning the connection device 21' on the back side $26_{yz}'$ of the daughter card 26. More particularly, the registration pins 56' of the connection device 21' are inserted through the corresponding registration openings 52 in the daughter card 26. Note that due to the construction of the connection device 21', the companion-coordinating side 28' may be adjusted as necessary in the y direction and the z direction to accomplish this insertion. In any event, once the relevant registrants have been properly mated or registered, the companion-interfacing contacts 42' will be precisely positioned relative to the card, or companion, contacts 36'.

In a single-side connection arrangement, the connection device 21' would then be securely mounted in this precisely aligned position. However, in a dual-side connection arrangement, the other connection device 21 must first be correctly positioned relative to the front side $26_{yz}$ of the daughter card 26. This positioning is done by inserting its registration pins 56 through the corresponding, and yet unoccupied, registration openings 52 in the daughter card 26. (As is explained in more detail below, the electrical circuitry system 220 is designed so that the registrants of the relevant components may properly coordinate.) To accomplish this insertion, the companion-coordinating side 28 of the device 21 may be adjusted as necessary in the y direction and the z direction.

Once the connection device 21' has been positioned correctly, relative to the back side $26_{yz}'$ of the daughter card 26, and the connection device 21 has been positioned correctly, relative to the front side $26_{yz}$ of the card, the connection devices 21 and 21' may be securely mounted to the daughter card 26. This mounting is accomplished by inserting a pair of card mounting fasteners 260 which are similar in some ways, to the mounting fasteners 160 used in the single-side connection arrangement of FIG. 1. For example, the heads of the fasteners 260 (not specifically numbered) are designed so that they will lie flat against the outer side 30 of the connection device 21. However, the shafts of the fasteners 260 (not specifically numbered) are substantially longer than the shafts of the fasteners 160 whereby they may extend through and beyond, both the connection devices 21 and 21'.

To securely mount the connection devices 21 and 21' in position, the card mounting fasteners 260 are inserted through the generally aligned "card side" mounting openings in the relevant components. Although not specifically shown in FIGS. 12A and 12B, these mounting openings include sequentially, the mounting openings 156 in the modular support member 70, the mounting openings 154 in the companion-positioner 74, the mounting openings 152 in the flexible circuit strip 22, the mounting openings 150 in the daughter card 26, the mounting openings 152' in the flexible circuit strip 22', the mounting openings 154' in the companion-positioner 74' and the mounting opening 156' in the modular support member 70'. As indicated above, the fasteners 260 are sized so that they will extend through and beyond, these components. Nut-members 262 are mated with the distal end portions of the fasteners 260 whereby the connection devices 21 and 21' will be locked in the mounting position.

In coupling the connection devices 21 and 21' to the daughter card 26, alignment sleeves 264 may be helpful. For example, the alignment sleeves 264 may be inserted through the mounting opening 150 in the daughter card 26 and inserted partially through the connection devices 21 and 21'. More specifically, one end of the sleeves 264 may be inserted through the mounting openings 154 and 156 in the companion-positioner 74 and the support member 70, respectively, and the other end of the sleeves 264 may be inserted through the mounting openings 154' and 156' in the companion-positioner 74' and the support member 70', respectively. The openings 156 and 156' in the support members 70 and 70' are dimensioned to tightly receive the sleeves 264, however, the openings 154 in the companion-positioners 74 and 74' and 154' are dimensioned to loosely receive the sleeves 264. In this manner, floating adjustment of the companion-positioners 74 and 74' is still possible. Once the necessary adjustments have been made and the connection devices 21 and 21' are precisely aligned with the daughter card 26, the mounting fasteners 260 may be installed in the above-described manner. The alignment sleeves 264 and the mounting fasteners 260 are dimensioned so that the fasteners may be inserted through the sleeves.

Once the fasteners 260 have been locked in the mounting position, the daughter card 26 will be locked in a certain position relative to the card-side components of the flexible circuit strips 22 and 22' and the connection devices 21 and 21'. More particularly, further movement of the modular support member 70 and the companion-positioner 74 of the front connection device 21, and further movement of the modular support member 70' and the companion-positioner 74' of the back connection device 21', will be prevented. This prevention is, of course, desired because the relevant electrical contacts are precisely positioned relative to each other.

The connection devices 21 and 21' and the daughter card 26 coupled thereto, may then be mounted to the mother board 24. This coupling step is performed substantially the same way for each connection device 21/21' as was outlined above for the electrical circuitry system 20. However, it may be noted the front companion-coordinating side 28, and the back companion-coordinating side 28' may be adjusted independently of each other.

As one may appreciate, it is important in a dual-side connection arrangement that the registrants of both of the connection devices 21 and 21' be properly coordinated with the alignment members of the other components. For example, because the connection devices 21 and 21' are opposite, rather than identical or symmetrical in orientation, the mother board 24 must be adapted to accommodate either orientation. Additionally, the card-side components must be adapted to allow the coupling of both the connection devices 21 and 21' to the daughter card 26.

Figure 13A:
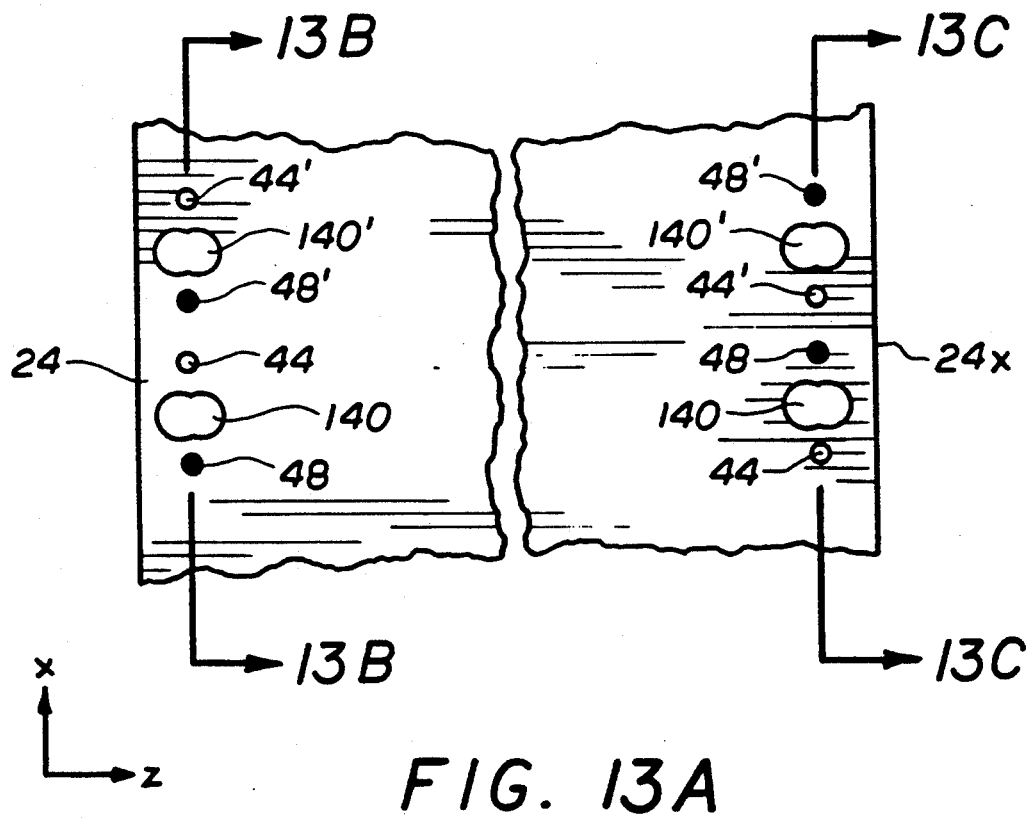
FIGS. 13A, 13B, and 13C are schematic illustrations depicting the coordination of the board-interface alignment members in the data processing system shown in FIGS. 12A and 12B.
Figure 13B:
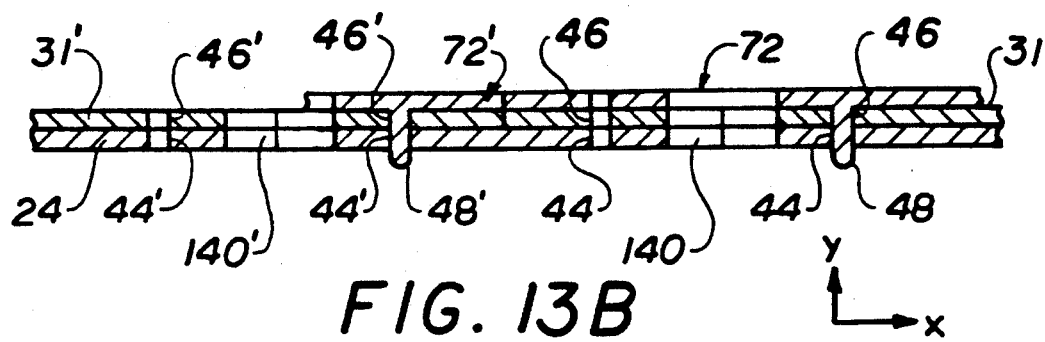
Figure 13C:
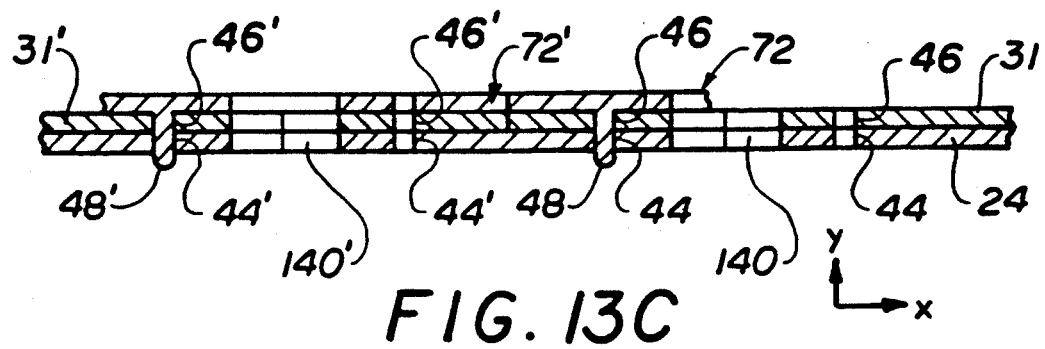

The features of the connection device 21 and other components of the electrical circuitry system 220 which make the coordination of the registrants in a dual-side connection arrangement possible, are best explained by referring additionally to the schematic illustrations contained in FIGS. 13A–C and 14A–C. Examining initially the board-side registrants, the general layout of these registrants is schematically depicted in FIGS. 13A and 13B. As is best seen in FIG. 13A, in each group of opposed registration pins 48 and 48', one is offset towards the daughter card 26 while the other is offset away from the daughter card. In this regard, it may be recalled that the registration openings 44/44' on the mother board 24 are grouped in pairs, as are the registration openings 46 and 46' on the flexible circuit strips 22 and 22'. Consequently, either one of these offsets may be accommodated.

When the electrical circuitry system 220 is fully assembled, one member of each pair of the registration openings will remain unoccupied. As is best seen by referring additionally to FIGS. 13B and 13C, the unoccupied registration openings 44/44' on the mother board 24 and the unoccupied registration openings 46/46' on the primary-interfacing section 31/31' of the flexible circuit strip 22/22' are precisely aligned with each other. Additionally, the registration openings 50/50' on the connection device 21/21' will be precisely aligned with the unoccupied openings 44/44' and 46/46'.

In this particular arrangement, the unoccupied registration openings do not serve any special function. As such, the unoccupied openings 44 and 44' on the mother board 24 could be omitted, if desired, in the fabrication of the board 24. The unoccupied openings 46/46' on the flexible circuit strip 22/22', and the registration openings 50/50' on the connection device 21/21', could also be omitted. However, the omission of the openings 50/50' would substantially limit the existing interchangeability of the primary positioners 72/72' and the companion positioners 74/74' of the connection devices 21/21'. Additionally, the omission of the unoccupied openings 46/46' on the flexible circuit strip 22/22' would prevent the strip from being used in other electrical circuitry systems, such as the system 320 discussed below.

Figure 14A:
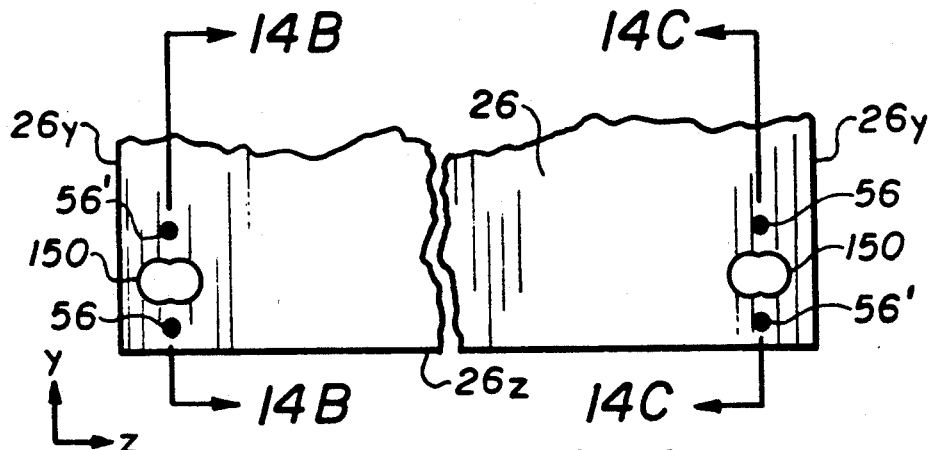
FIGS. 14A, 14B, and 14C are schematic illustrations depicting the coordination of the card-interface alignment members in the data processing system shown in FIGS. 12A and 12B.
Figure 14B:
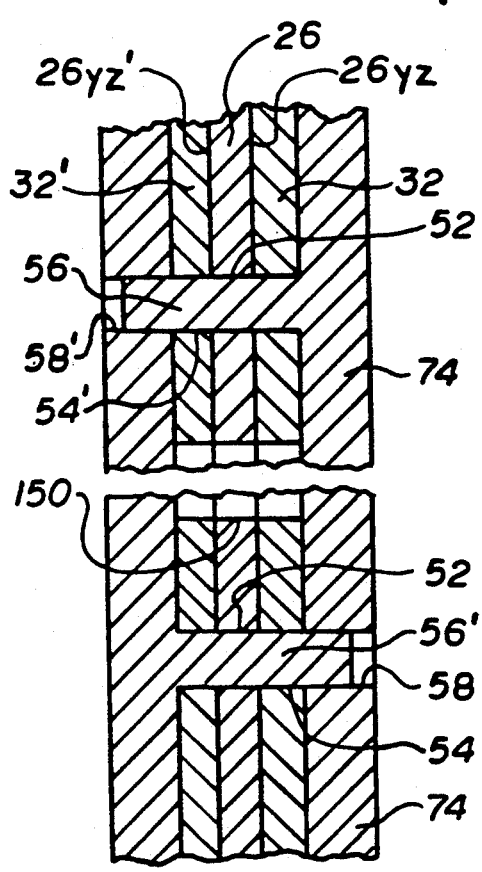
Figure 14C:
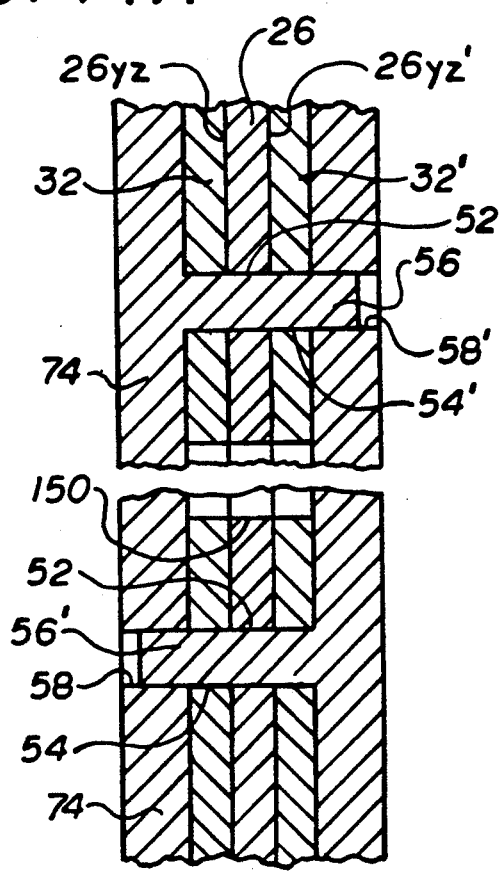

Turning now to the card-side registrants, the general layout of these members is schematically depicted in FIGS. 14A, 14B, and 14C. As is best seen in FIG. 14A, in each group of opposed registration pins 56 and 56', one is offset towards the mother board 24 while the other is offset away from the mother board. However, as was briefly alluded to above, in a dual-side connection arrangement all of the registration openings are occupied. More particularly, as is most clearly shown in FIGS. 14B and 14C, each registration pin 56 on the front connection device 21 will extend through the corresponding registration opening 54 in the companion-interfacing section 32, through the corresponding registration opening 52 in the daughter card 26, through the corresponding registration opening 54' in the back companion-interfacing section 32', and will be received in the corresponding registration opening 58' in the back connection device 21'.

Likewise, each registration pin 56' on the back connection device 21' will extend through the corresponding registration opening 54' in the back companion-interfacing section 32', through the corresponding registration opening 52 in the daughter card 26, through the corresponding registration opening 54 in the front companion-interfacing section 32, and will be received in the corresponding registration opening 58 in the front connection device 21.

One may now appreciate that the electrical circuitry system 220 comprises a primary circuit surface $24_{xz}$, first and second companion circuit surfaces $26_{yz}$ and $26_{yz}'$, first and second interfacing circuit surfaces 22 and 22', and a pair of connection devices 21 and 21'. The connection device 21 electrically couples the primary circuit surface $24_{xz}$ to the companion circuit surface $26_{yz}$ via the interfacing circuit surface 22; the other connection device 21' electrically couples the primary circuit surface $24_{xz}$ to the companion circuit surface $26_{yz}'$ via the interfacing circuit surface 22'. Thus, because this embodiment of the connection device 21 is designed to alternatively accommodate either side of the daughter card 26, a pair of such devices may be used in a dual-side connection arrangement. In this manner, identical connection devices may be used to accommodate both single-side and dual-side arrangements, and each connection device may be used on either side of the daughter card 26.

Electrical Circuitry System 320

Figure 15A:
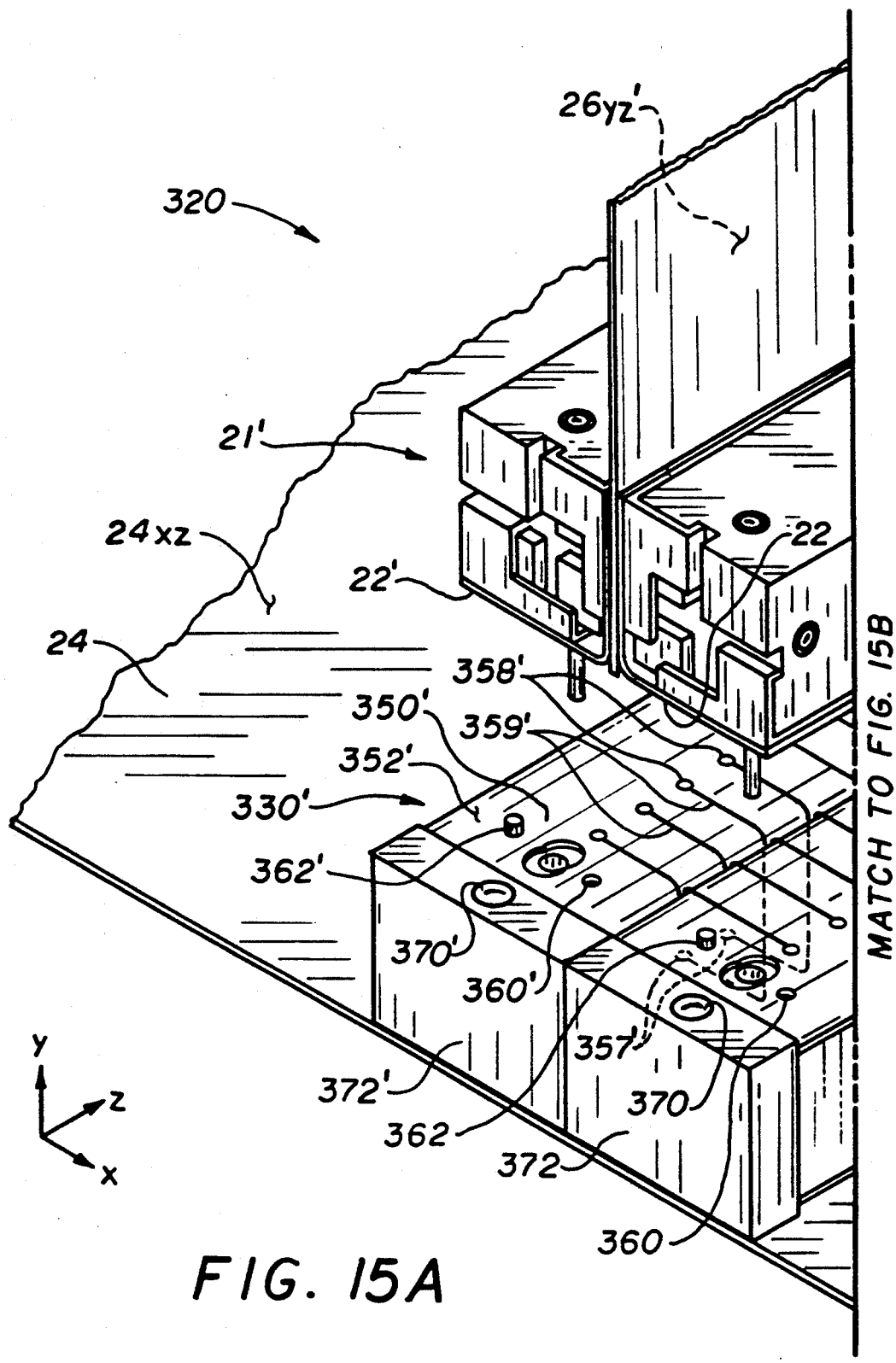
FIG. 15A and 15B collectively form a perspective exploded view of another data processing system which is similar to that shown in FIGS. 12A and 12B except that it additionally includes intermediate flexible-circuit members.
Figure 15B:
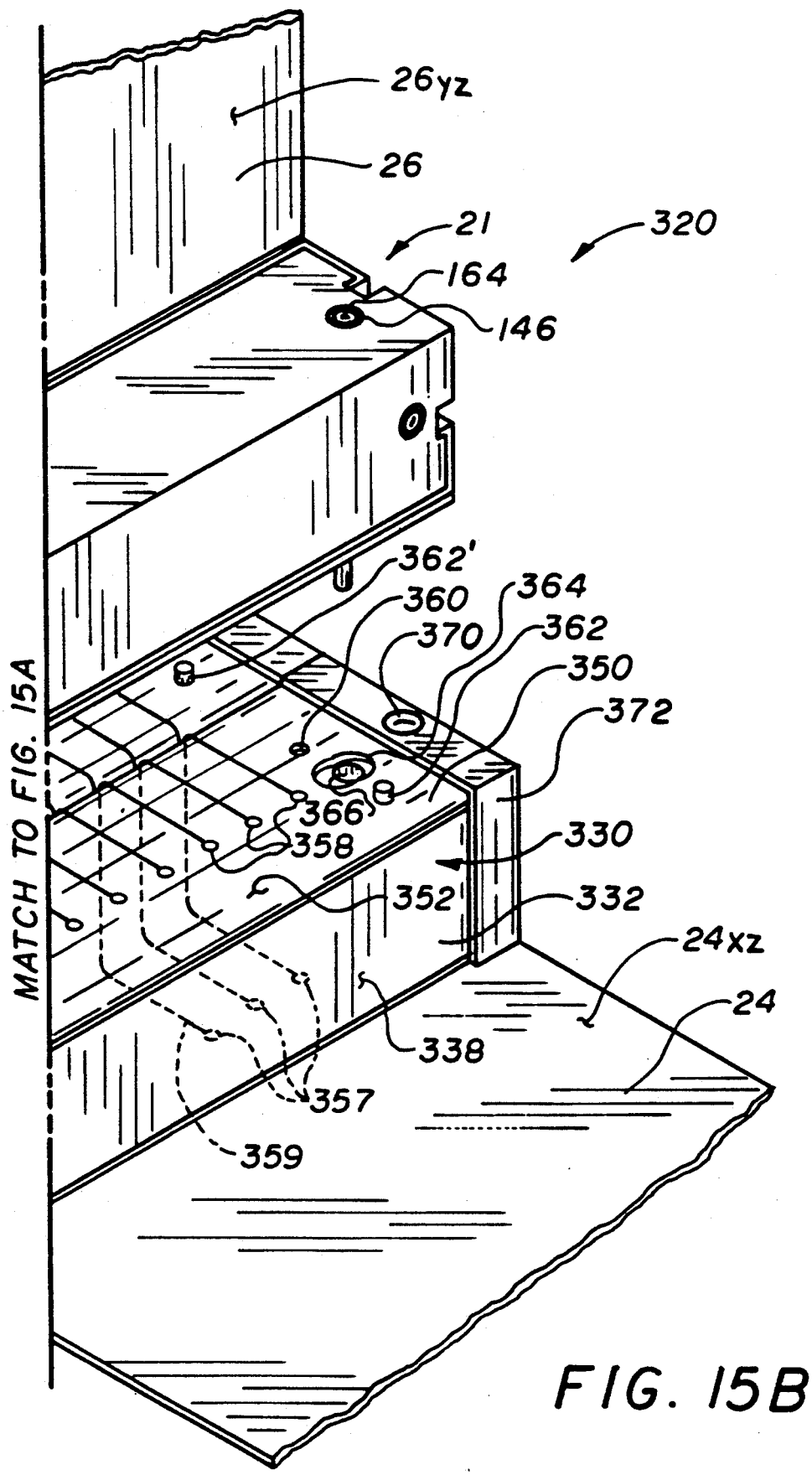
Figure 16:
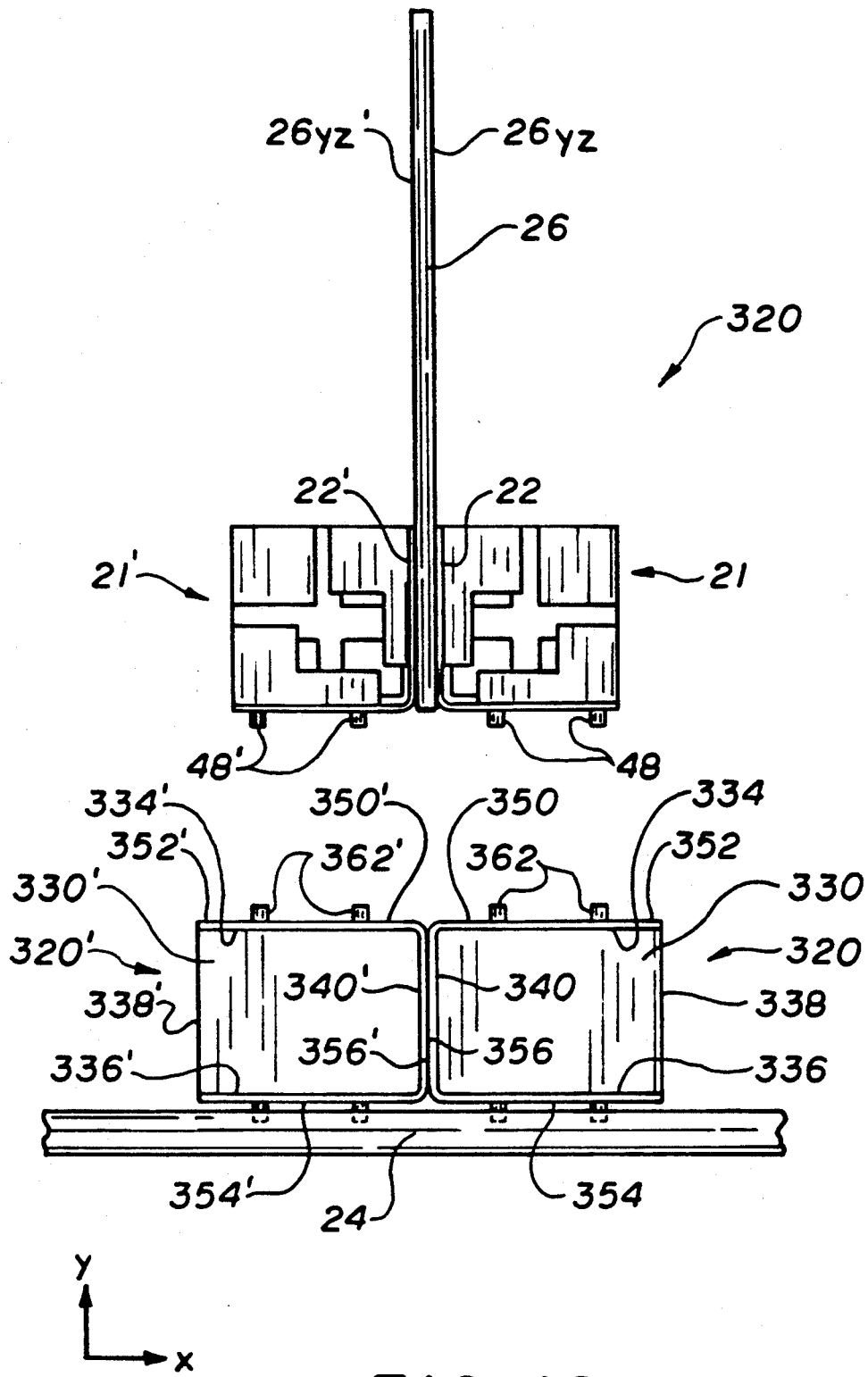
FIG. 16 is a schematic end view of the data processing system of FIGS. 15A and 15B.

Referring now to FIGS. 15A–B and 16, another electrical circuitry system 320 according to the present invention is shown. The system 320, which is of a dual-side connection arrangement, includes many of the same components as the electrical circuitry system 220, and, as such, like reference numerals and suffixes are used to designate like parts. However, the electrical circuitry system 320 additionally includes intermediate, or nexus, elements 330 and 330' which form an electrical link in the system 320.

In the electrical circuitry system 320, as with the earlier discussed systems, the mother board 24 includes a first set of board contacts 34 and a second set of board contacts 34' arranged on its top side $24_{xz}$. However, unlike the previously discussed systems, the top side $24_{xz}$ of the mother board 24 is not the primary circuit surface and thus the board contacts 34 and 34' do not function as the primary contacts. Instead, as is explained in more detail below, portions of the nexus elements 330 and 330', rather than the top side $24_{xz}$ of the mother board 24, constitute the primary circuit surface in this particular electrical circuitry system.

One similarity between the system 320 and the above-discussed system 220, is that they are both of a dual-side arrangement. More particularly, the front side $26_{yz}$ of the daughter card 26 constitutes one companion circuit surface and the back side $26_{yz}'$ of the daughter card 26 constitutes another companion circuit surface. As such, although not specifically shown in the drawings, the daughter card 26 includes a set of companion contacts 36 on its front side $26_{yz}$ and another set of companion contacts 36' on its back side $26_{yz}'$. The companion circuit surfaces $26_{yz}$ and $26_{yz}'$ are electrically coupled to the primary circuit surface via two connection devices 21 and 21', respectively.

Turning now to the nexus element 330, its structural skeleton is a support bar 332 which is substantially square in transverse shape, and thus may be viewed as having four surfaces or sides. More particularly, the support bar 332 includes a top side 334, a bottom side 336, and two lateral sides 338 and 340. In the illustrated orientation, the top side 334 and the bottom side 336 are positioned in planes parallel to the x-z plane; while the lateral sides 338 and 340 are positioned in planes parallel to the y-z plane. The nexus element 330', which is essentially identical to the nexus element 330, includes corresponding components. As is best seen in FIG. 16, in the assembled system, the lateral side 340 of the nexus element 330 is positioned adjacent the lateral side 340' of the nexus element 330'.

The nexus element 330 further includes a nexus circuit surface which is in the form of a nexus flexible circuit strip 350. The strip 350 is wrapped around three sides of, and secured to, the support bar 332. Thus, as is best seen in FIG. 16, in the assembled system 320 the transverse geometry of the nexus strip 350 will be generally of a C-shape. Consequently, the nexus strip 350 may be viewed as having a top section 352 which is positioned adjacent the top side 334, a bottom section 354 which is positioned adjacent the bottom side 336, and a side section 356 therebetween which is positioned adjacent the lateral side 340. The nexus strip 350' includes correlating components, whereby, in the assembled electrical circuitry system 320, transverse geometry of the strip 350' will be generally of a backwards C-shape, as is shown in FIG. 16.

As indicated above, the nexus strips 350 and 350' provide an electrical link between the mother board 24 and the other components of the electrical circuitry system 320. To this end, the nexus strip 350 includes a set of bottom nexus contacts 357 arranged on its bottom section 354, and a corresponding set of top nexus contacts 358 arranged on its top section 352. The top nexus contacts 358 are electrically connected to the bottom nexus contacts 357 by electrical lines 359 which travel in a substantially C-shape path. The nexus strip 350' includes similar contacts 357' and 358', which are correspondingly electrically connected to each other by a set of electrical lines 359'.

The bottom nexus contacts 357 and 357' are arranged in a bottom contact pattern corresponding to the contact pattern of the board contacts 34 and 34', respectively, on the mother board 24. The top nexus contacts 358 and 358' are each arranged in a pattern which is the primary contact pattern in this particular system. In the illustrated embodiment, the relevant electrical contacts are shown arranged in rows in the z direction and exaggerated in size and density setting. However, as was discussed above, in a typical application, the pattern or artwork of the contacts would probably be very complex and thus of a very minute size and high density.

To ensure proper positioning with the rest of the electrical circuitry system 320, the nexus elements 330 and 330' include coordinating registrants. More particularly, the nexus strip 350 includes registration openings 360 on its top section 352 and similar openings (not specifically shown or numbered) on its bottom section 354. The nexus strip 350' includes similar registration openings 360' on its top section 352' and similar openings (not specifically shown or numbered) on its bottom section 354'. A detailed explanation of these registration openings is not believed to be necessary because the registration openings are generally arranged in a fashion similar to the registrants on the flexible circuit strip 22. Nonetheless, perhaps it should be re-emphasized that the registrants 360/360' on the top section 352/352' are precisely located relative to the top nexus, or primary contacts 358/358'; and that the registration openings on the bottom section 354/354' are precisely located relative to the bottom nexus contacts 357/357'.

The registrant structure of the nexus elements 330 and 330' also includes registration pins 362 and registration openings (not specifically numbered) on the top side 334 of the support bar 332. Additionally, on its bottom side 336, the support bar 332 includes registration pins and registration openings (not specifically numbered). The registration pins 362 on the top side 334 are shaped and arranged to mate, or register, with the registrants 360 on the top section 352 of the strip 350; while the registration pins on the bottom side 336 are shaped and arranged to mate, or register, with the registration openings on the bottom section 354 of the strip 350.

The registration pins on the support bar 332 are arranged in the same offset manner as the registration pins 48 and 56 on the connection device 21. In this manner, the registrants of the nexus element 330 may aid in the proper alignment of this component without interfering with the previously described registration process between other components of the system 320. The support bar 332' of the other nexus element 330' likewise includes registration pins 362' and registration openings (not specifically numbered) on its top side 334' and registration pins and registration openings (not specifically numbered) on its bottom side 336'.

In the early assembly stages of the electrical circuitry system 320, the nexus flexible circuit strip 350 is wrapped around the support bar 332 and the corresponding registrants are properly coordinated. Likewise, the nexus flexible circuit strip 350' is wrapped around the support bar 332' and the corresponding registrants are properly coordinated. This wrapping-/registration procedure is similar to that described above in reference to securing the flexible circuit strip 22 on the connection device 21. In any event, when the nexus registrants are properly coordinated, the top registration pins will extend upward beyond the strip 350/350' and the bottom registration pins 362/362' will extend downward beyond the strip 350/350'.

The support bar 332, with the strip 350 wrapped therearound, may then be coupled to the mother board 24 by inserting the bottom registration pins into the corresponding registration openings 44 on the board 24. Additionally, the support bar 332', with the strip 350' wrapped therearound, may be coupled to the mother board 24 by inserting the bottom registration pins into the corresponding registration openings 44' on the board 24. Because of the exact positioning of the registrants relative to the pertinent electrical contacts, the bottom nexus contacts 357 and 357' will be precisely aligned with respect to the board contacts 34 and 34', respectively.

Once the nexus elements 330 and 330' have been precisely aligned relative to the mother board 24, they may be mounted in this position. This mounting may be accomplished by screws 370 and 370' and cribs 372 and 372' which are designed to cradle the nexus elements 330 and 330'. The cribs 372/372' receive the distal ends of the screws 370/370' and consequently this arrangement eliminates the need for the board mounting back-up plate 166. In any event, the top sections 352 and 352' of the nexus flexible circuit strips 350 and 350' together form the primary circuit surface whereby the top nexus contacts 358 and 358' comprise the primary contacts in the electrical circuitry system 320.

In the preferred assembly process, the connection devices 21 and 21' and the flexible circuit strips 22 and 22' are coupled to the daughter card 26 in the same manner as was outlined above for system 220. As such, these assembly steps will not be again explained in detail. However, it may be noted once again that when this stage of the assembly is completed, the companion-positioners 74 and 74', and the support members 70 and 70', will be securely mounted in place relative to the daughter card 26.

The daughter card 26, with the connection devices 21 and 21' mounted thereon, may then be registered with and mounted to, the nexus elements 330 and 330'. In this registration/mounting step, the primary-positioners 72 and 72' may be adjusted in the x direction and the z direction, independently of the rest of the respective connection device and independently of each other. In this manner, the necessary bi-directional adjustments may be made in order for the corresponding registrants to mate or register with each other.

In the actual registration process, the registration pins 48 on the connection device 21 are inserted through the corresponding registration openings in the top side 334 of the support bar 332 and the top section 352 of the nexus flexible circuit strip 350. Almost, if not entirely, simultaneously, the top registration pins 362 will be inserted through the previously unoccupied registration openings 46 in the flexible circuit strip 22 and into the registration openings 50 in the connection device 21. Thus, in the electrical circuitry system 320, the heretofore "extra" registration openings 50 on the connection device 21 are necessary for the relevant registrants to properly register.

Once the connection devices 21 and 21' have been properly registered with the nexus elements 330 and 330', respectively, they may be securely mounted in this position. This mounting is accomplished by the mounting fasteners 164 which, as shown in FIGS. 15A and 15B, extend through the mounting openings 146 in the support member 70, through the mounting openings 144 in the primary positioner 72, and through and beyond the mounting openings 142 in the flexible circuit strip 22. The distal ends of the fasteners 164 may then be inserted through mounting openings 364 in the nexus flexible circuit strip 350, and received in mounting openings 366 in the support bar 332. The nexus element 330 is designed in such a manner that when the fasteners 164 are received in the mounting openings 366, the connection device 21 may be locked in place. Fasteners 164' are used in a similar manner to lock the connection device 21' in place relative to the nexus element 330'.

One may now appreciate that the electrical circuitry system 320 comprises a primary circuit surface 352 and 352', first and second companion circuit surfaces $26_{yz}$ and $26_{yz}'$, first and second interfacing circuit surfaces 22 and 22', and a pair of connection devices 21 and 21'. The connection device 21 electrically couples the portion 352 of the primary circuit surface to the companion circuit surface $26_{yz}$ via the interfacing circuit surface 22; while the other connection device 21' electrically couples the portion 352' of the primary circuit surface to the companion circuit surface $26_{yz}'$ via the interfacing circuit surface 22'.

One may further appreciate that the connection device 21, regardless of the electrical circuitry system that it is used in, allows for bi-directional adjustments both with respect to the primary circuit surface and the companion circuit surface. Additionally, the design of the connection device 21 results in a flattening force, independent of any coupling or mounting force, being applied in both the primary and companion direction. These features will prove to be very advantageous in many applications. However, in some applications bi-directional adjustments, and/or flattening forces, may be necessary with respect to only one of either the primary or the companion circuit surface. While the connection device 21 may still be used in such applications, the connection device 521 discussed below in reference to electrical circuitry system 520 may be a more desirable choice.

Electrical Circuitry System 520

Figure 17:
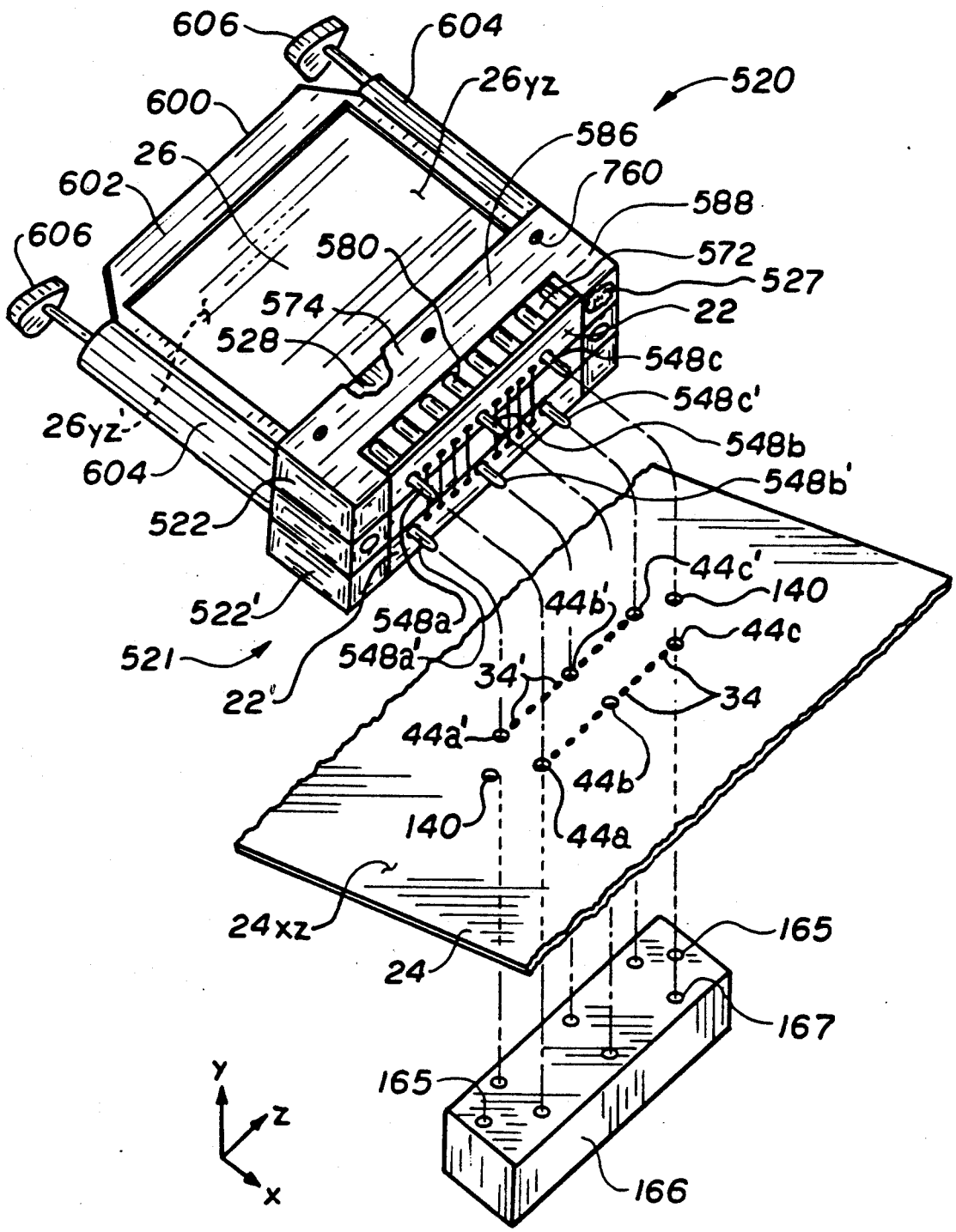
FIG. 17 is a perspective exploded view of another data processing system which includes a mother board, a daughter card, a connection device according to a second embodiment of the invention, and a flexible circuit strip.
Figure 18:
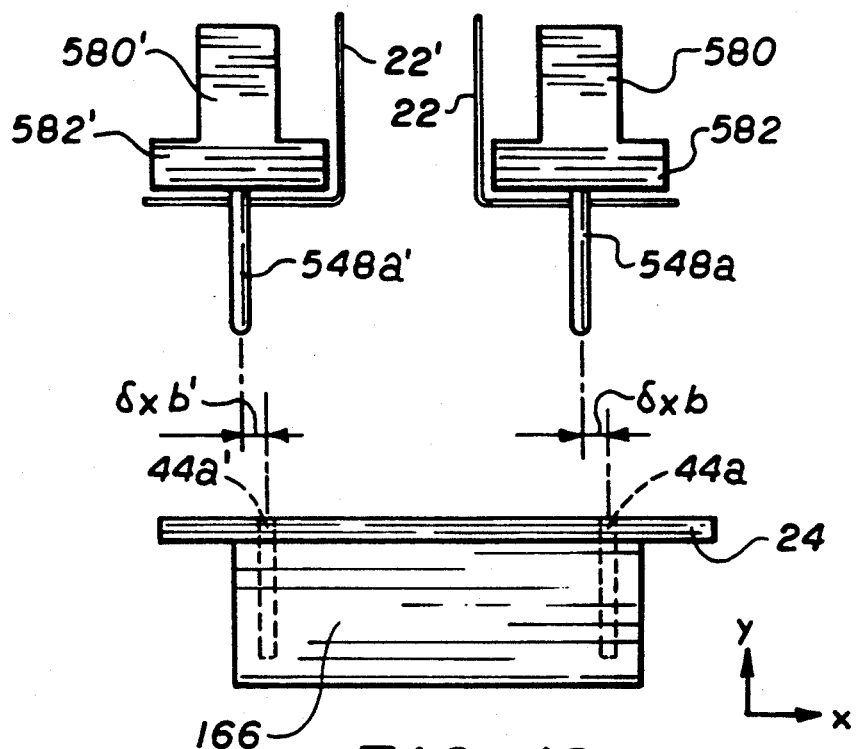
FIG. 18 is a schematic side view of certain components of the data processing system of FIG. 17.
Figure 19:
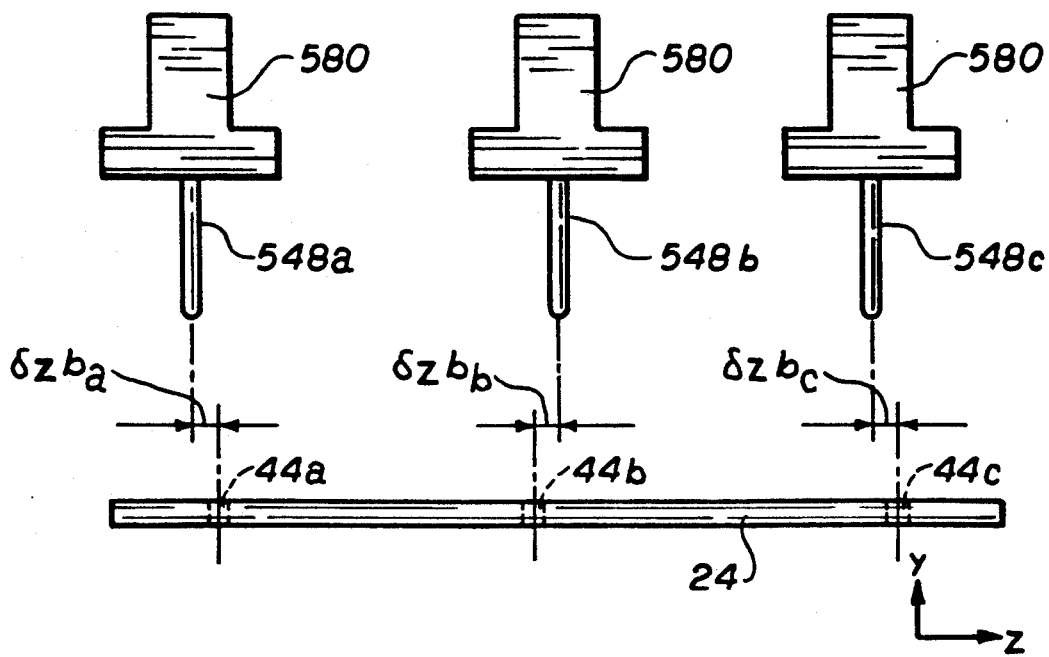
FIG. 19 is a schematic front view of certain components of the data processing system of FIG. 17.

Turning now to FIGS. 17, 18 and 19, an electrical circuitry system 520, which includes a connection device 521 according to another embodiment of the present invention is shown. The electrical circuitry system 520 additionally includes components similar to, or the same as, those included in the above described systems 20, 220, and 320, and consequently like reference numerals will be assigned to these similar components. These similar components include two flexible circuit strips 22 and 22', a mother board 24, and a daughter card 26.

In comparison to the above-described systems, the electrical circuitry system 520 is perhaps most similar to the electrical circuitry system 220. To this end, it may be noted that the system 520 is of a dual-side arrangement. In this dual-side arrangement, the top side $24_{xz}$ of the mother board 24 constitutes the primary circuit surface; the front and back sides $26_{yz}$ and $26_{yz}'$ of the daughter card 26 constitute the first and second companion circuit surfaces, respectively; and the flexible circuit strips 22 and 22' constitute the first and second interfacing circuit surfaces, respectively.

Although not entirely specifically shown in the drawings, the various circuit surfaces include electrical contacts and registrants which are precisely positioned relative to the corresponding electrical contacts. While the registrant/contact layout in system 520 could be identical to that in system 220, it is slightly different in the preferred and illustrated embodiment. More specifically, as best seen in FIG. 17, the registrants 44/44', while still precisely positioned relative to the primary contacts 34/34', are positioned aligned with, rather than offset from, the row of contacts 34/34'. A first registration opening $44_a$ is positioned at one end of the row of contacts 34, a second registration opening $44_b$ is positioned intermediate the row, and a third registration opening $44_c$ is positioned at the opposite end of the row. A parallel set of registrants $44_a'$, $44_b'$, and $44_c'$ are positioned in a similar manner in the row of contacts 34'. The registrants on the flexible circuit strips 22 and 22' are also situated in a corresponding fashion.

Additionally, in contrast to the electrical circuitry system 220, only one connection device 521 is used in this present system 520 to electrically couple the primary circuit surface $24_{xz}$ to both of the companion circuit surfaces $26_{yz}$ and $26_{yz}'$. Nonetheless, the connection device 521 may be viewed as an assembly having a front connection device 522 and a back connection device 522', which are preferably, although not necessarily, connected via certain framing and mounting components. When viewed in this manner, the connection device 521 is more easily compared to the connection device 21 discussed above.

Addressing initially the front connection device 522, it includes a primary-coordinating side 527 which is adapted to be positioned parallel to the primary circuit surface $24_{xz}$ and a companion-coordinating side 528 which is adapted to be positioned parallel to the companion circuit surface $26_{yz}$. The primary-coordinating side 527 and the companion-coordinating side 528 form a part of a primary positioner 572 and a companion-positioner 574, respectively.

The primary positioner 572 includes a set of primary-positioner registrants $548_a$, $548_b$, and $548_c$ which are sized and arranged to mate with the registrants 44 of the board 24 and with the registrants of the primary-interfacing section of the flexible circuit strip 22. Additionally, although not specifically shown in the drawings, the companion positioner 574 includes a set of companion-positioner registrants which are sized and arranged to mate with the registrants of the daughter card 26 and the companion-interfacing section of the flexible circuit strip 22.

The primary positioner 572 includes a connecting portion 580 and a board-abutting portion 582 coupled thereto. The companion positioner 574 is of a generally elongated C-shape form and includes a top portion 586 and two relatively shorter portions 588 extending from opposite ends therefrom. The portions 586 and 588 define a chamber in which the primary positioner 572 is located. More specifically, the connecting portion 580 of the primary positioner 572 is secured adhesively, or in any other suitable manner, to the bottom surface of the companion-positioner 574. As is best seen in schematic FIGS. 17 and 18, the primary-coordinating side 527 of the primary positioner 572 constitutes the bottom surface of the board-abutting portion 582, and the companion-coordinating side 528 of the companion-positioner 574 constitutes the inner surface of the top portion 586.

As was indicated above, the primary positioner 572 is secured to the bottom surface of the companion-positioner 574. While the companion-positioner 572 is preferably made of a rigid material, the primary-positioner 572 is made of an elastomeric material. The particular properties of the elastomeric material are selected so that the primary positioner is selectively removable in two perpendicular (and other) directions defining a primary adjustment area parallel to the x-z reference plane, and thus parallel to the primary-coordinating side 527 of the connection device 522. In this manner, the primary positioner 572 may be manipulated as necessary to allow the mating, or registration, of the registrants $548_a$, $548_b$, and $548_c$ with the corresponding board registrants $44_a$, $44_b$, and $44_c$.

As indicated above, the connection device assembly 521 additionally includes a back connection device 522' which includes a primary positioner and a companion positioner. These positioners are of an essentially identical design to those of the front connection device 522. The connection device assembly 521 further includes a board-frame member 600 which includes a border portion 602 and two mounting cylinders 604 on either side thereof. The border portion 602 surrounds the daughter card 26, while the mounting cylinders 604 each include a mounting rod 606 extending therethrough.

In the preferred assembly process of the electrical circuitry system 520, the flexible circuit strips 22 and 22' are attached to the companion-positioners, and the positioners are then coupled to the daughter card 26. This coupling is accomplished by the registration of the relevant components and then coupling the companion-positioners thereto as with mounting fasteners 760. It may be noted at this point that both the registration and coupling functions may be accomplished by the mounting fasteners 760 if desired. Alternatively, the companion-positioners, and the daughter card 26 may include coordinating registrants such as those discussed above in relation to the electrical circuitry system 220.

Once the companion-positioners have been securely coupled to the daughter card 26, the primary-positioners may be properly positioned relative to the mother board 24. More particularly, the registrants $548_a/548_a'$, $548_b/548_b'$, and $548_c/548_c'$, may be registered with the corresponding board registrants $44_a/44_a'$, $44_b/44_b'$, and $44_c/44_c'$. To accomplish this registration, the primary positioners may be adjusted, independently of each other and independently of their respective companion-positioners, in the adjustment area.

The registered connection devices 522 and 522' may then be securely mounted to the mother board 24 by the mounting cylinders 604. The mounting rods 606, which are preferably resiliently contained within their respective cylinders 604 (although not specifically shown in the drawings), may then be inserted through mounting openings 140 in the board 24. A board-mounting back-up plate 166 receives the distal ends of the mounting rods 606 in openings 165, and receives the distal ends of the registrants 548/548' in the slots 167.

When mounted in this manner, the elastomeric nature of the primary positioner 572 also performs as an elastomeric primary flattener for applying a flattening force on the circuit strip 22. This flattening force is applied outwardly in the y direction, which is substantially perpendicular to the primary adjustment area. In any event, it is important to note that in this embodiment, in contrast to the connection device 21, the flattening force is not independent from the mounting force.

One may now appreciate that the electrical circuitry system 520 comprises a primary circuit surface $24_{xz}$, and first and second companion circuit surfaces $26_{yz}$ and $26_{yz}'$, first and second interfacing circuit surfaces 22 and 22', and a pair of connection devices 522 and 522'. The connection device 522 electrically couples the primary circuit surface $24_{xz}$ to the companion circuit surface $26_{yz}$ via the interfacing circuit surface 22; the other connection device 522' electrically couples the primary circuit surface $24_{xz}$ to the companion circuit surface $26_{yz}'$ via the interfacing circuit surface 22'. One may further appreciate that the connection device assembly 521 allows for bi-directional adjustments with respect to the primary circuit surface. Additionally, the design of the connection device assembly 521 results in a flattening force being applied in the primary and companion directions.

Closing

One may now appreciate that the connection devices 21 and 521 of the present invention are particularly designed to electrically couple a primary circuit surface to a companion circuit surface via a multi-section interfacing circuit surface. The connection devices 21 and 521 are designed so that they may be used with interfacing circuit surfaces having relatively short lead lengths resulting in high electrical performance and low cost. Additionally, they are adapted to allow for a reduction in tolerance buildup whereby a high interconnect density is possible. Still further the connection devices 21 and 521 are designed so they are easy to install and replace in the field.

Although the invention has been shown and described with respect to certain preferred embodiments, it is obvious that equivalent alterations and modifications will occur to others skilled in the art upon the reading and understanding of this specification. The present invention includes all such equivalent alterations and modifications and is limited only by the scope of the following claims.

What is claimed is:

1. A connection device for electrically coupling a primary circuit surface to a companion circuit surface via a multi-section interfacing circuit surface, said device comprising:
   a companion positioner including:
      a companion-coordinating side which is adapted to be positioned parallel to the companion circuit surface, and
      a set of companion-positioner registrants for precisely positioning said companion-positioner relative to the companion circuit surface and a section of the interfacing circuit surface; and
   a primary positioner, coupled to said companion positioner, and including:
      a primary-coordinating side which is adapted to be positioned parallel to the primary circuit surface, and
      a set of primary-positioner registrants for precisely positioning said primary-positioner relative to the primary circuit surface and another section of the interfacing circuit surface;
   said primary-positioner being selectively adjustable, independent of said companion-positioner, in two perpendicular directions defining a primary adjustment area parallel to said primary-coordinating side.

2. A connection device as set forth in claim 1 further comprising an elastomeric primary-flattener for applying a primary flattening force on the interfacing circuit surface, said flattening force being in a direction substantially perpendicular to said primary adjustment area and outwardly from said primary-coordinating side.

3. A connection device as set forth in claim 2 wherein said primary positioner is made of an elastomeric material whereby it may also function as said elastomeric primary-flattener.

4. A connection device as set forth in claim 2 wherein said companion-positioner is selectively adjustable, independently of said primary-positioner, in two perpendicular directions defining a companion adjustment area which is parallel to said companion-coordinating side of said connection device.

5. A connection device as set forth in claim 4 further comprising an elastomeric companion-flattener for applying a companion flattening force on the interfacing circuit surface, said flattening force being in a direction substantially perpendicular to said companion adjustment area and outwardly from said companion-coordinating side.

6. A connection device as set forth in claim 1 wherein said primary-positioner and said companion-positioner are essentially identical in configuration and may be used interchangeably in the assembly of said connection device.

7. A connection device as set forth in claim 6 wherein:
   said connection device further comprises a modular support member which includes a set of primary-support couplers and a set of companion-support members;
   said primary-positioner comprises a set of primary-positioner couplers shaped and arranged to modularly mate with said set of primary-support couplers; and
   said companion-positioner comprises a set of primary-positioner couplers shaped and arranged to modularly mate with said set of companion-support couplers.

8. A connection device as set forth in claim 7 wherein said set of primary-support couplers comprise tracks extending in a first track-direction and said set of companion-support couplers comprise tracks extending in a second track-direction different from said first direction.

9. A connection device as set forth in claim 8 wherein said first track-direction is parallel to said primary-coordinating side and wherein said second track-direction is parallel to said companion-coordinating side.

10. A connection device as set forth in claim 9 wherein said primary-flattener comprises a primary-elastomeric band positioned between said main modular member and said primary-coordinating side.

11. A connection device as set forth in claim 10 wherein said companion-flattener comprises a companion-elastomeric band positioned between said modular support member and said companion-coordinating side of said companion-positioner.

12. A connection device as set forth in claim 11 wherein said primary-elastomeric band and said companion-elastomeric band are essentially identical and may be used interchangeably in the assembly of said connection device.

13. A connection device as set forth in claim 12 wherein said set of companion-positioner registrants comprise registration pins projecting outwardly from companion-coordinating side of said connection device, said registration pins being dimensioned so that they will extend through the interface circuit surface, and through and beyond the companion circuit surface.

14. A connection device as set forth in claim 13 wherein said set of primary-positioner registrants comprise registration pins projecting outwardly from said primary-coordinating side of said connection device, said registration pins being dimensioned so that they will extend through the interface circuit surface, and through and beyond the companion circuit surface.

15. A connection device as set forth in claim 14 wherein said companion registration pins are arranged in an offset, rather than aligned, manner.

16. An electrical circuitry system comprising a primary circuit surface, a companion circuit surface, an interfacing circuit surface, and a connection device which electrically couples said primary circuit surface to said companion circuit surface via said interfacing circuit surface;

said primary circuit surface including a set of electrical primary contacts which are arranged in a certain primary-contact pattern;

said companion circuit surface including a set of electrical companion contacts which are arranged in a certain companion-contact pattern;

said interfacing circuit surface including a primary-interfacing section on which a set of primary-interfacing electrical contacts are arranged in a pattern corresponding to said primary-contact pattern and a companion-interfacing section on which a set of companion-interfacing contacts, which are electrically connected to said primary-interfacing contacts, are arranged in a pattern corresponding to said companion-contact pattern;

said primary-interfacing section and said companion-interfacing section being joined together in such a manner that limited relative movement therebetween is possible;

said connection device including a companion-positioner coupled to said companion-interfacing section and to said companion circuit surface in such a manner that said companion-interfacing section is positioned between said companion-positioner and said companion circuit surface and said companion-interfacing contacts are precisely positioned relative to said companion-contacts;

said connection device further including a primary-positioner coupled to said primary-interfacing section and to said primary circuit surface in such a manner that said primary-interfacing section is positioned between said positioner and said primary circuit surface, said primary-positioner being adjustable, independently of said companion-positioner, in two perpendicular directions defining a primary adjustment area parallel to said primary circuit surface whereby said primary-interfacing contacts may be precisely positioned relative to said primary-contacts;

17. An electrical circuitry system as set forth in claim 16 wherein:

said primary circuit surface includes a set of primary registrants which are precisely positioned relative to said set of primary contacts in a certain primary-registrant layout;

said primary-interfacing section includes a set of primary-interfacing registrants which are sized and shaped to register with said primary registrants and which are precisely positioned relative to said primary-interfacing contacts in a certain layout corresponding so said primary layout whereby registration will result in said primary contacts being precisely aligned with said primary-interfacing contacts;

said primary-positioner allowing selective adjustment of said primary-interfacing registrants in said primary adjustment area whereby said primary-interfacing registrants may be adjusted relative to, and registered with, said primary registrants thereby precisely positioning said primary-interfacing contacts relative to said primary contracts.

18. An electrical circuitry system as set forth in claim 17 wherein said connection device further comprises an elastomeric primary-flattener for applying a flattening force on a portion of said primary-interfacing section generously encompassing said primary-interfacing contacts, said flattening force being applied in a direction substantially perpendicular to said primary adjustment area and towards said primary circuit surface.

19. An electrical circuitry system as set forth in claim 18 wherein said companion-positioner is selectively adjustable, independently of said primary-positioner, in two perpendicular direction defining a companion adjustment area which is parallel to said companion circuit surface whereby said companion-interfacing contacts may be precisely positioned relative to said companion-contacts; said companion adjustment area being non-parallel to said primary adjustment area.

20. An electrical circuitry system as set forth in claim 19 wherein:

said companion circuit surface includes a set of companion registrants which are precisely positioned relative to said set of companion-contacts in a certain companion-registrant layout;

said companion-interfacing section includes a set of companion-interfacing registrants which are sized and shaped to register with said companion registrants and which are precisely positioned relative to said companion-interfacing contacts in a layout corresponding to said companion-registrant layout whereby registration of said companion registrants and said companion-interfacing registrants will result in said companion contacts being precisely aligned with said companion-interfacing contacts; and said companion-positioner allowing selective adjustment of said companion-interfacing registrants in said companion adjustment area whereby said companion-interfacing registrants may be adjusted relative to, and registered with, said companion registrants thereby precisely positioning said companion-interfacing contacts relative to said companion contacts.

21. An electrical circuitry system as set forth in claim 20 wherein said connection device further comprises an elastomeric companion-flattener for applying a companion flattening force on a portion of said companion-interfacing section generously including said companion-interfacing contacts, said flattening force being in a direction substantially perpendicular to said companion adjustment area and towards said primary circuit surface.

22. An electrical circuitry system as set forth in claim 18 wherein said primary positioner is made of an elastomeric material whereby it may also function as said elastomeric primary-flattener.

23. An electrical circuitry system as set forth in claim 21 wherein:

said primary circuit surface is substantially planar in shape;

said companion circuit surface is substantially planar in shape;

said intermediate circuit surface is substantially L-shaped in transverse shape; and said connection device has a substantially rectangular transverse shape whereby said primary circuit surface will be positioned substantially perpendicular relative to said companion circuit surface.

24. An electrical circuitry system as set forth in claim 23 wherein said interfacing circuit surface comprises a flexible circuit strip which includes a pliable substrate whereby at least limited relative movement between said primary-interfacing section and said companion-interfacing section is possible.

25. An electrical circuitry system as set forth in claim 24 wherein said primary-positioner and said companion-positioner are essentially identical in configuration and may be used interchangeably in the assembly of said connection device.

26. An electrical circuitry system as set forth in claim 25 wherein:

said connection device further comprises a main modular member which includes a set of primary modularly mating members and a set of companion modular members;

said primary-positioner comprises a primary-modular member which includes a set of mating members sized and shaped to modularly mate with said set of primary-modularly mating members;

said companion-positioner comprises a companion-modular member which includes a set of mating members sized and shaped to modularly mate with said set of companion modular mating members.

27. An electrical circuitry system as set forth in claim 26 wherein:

said primary modular mating members are in the form of tracks extending in a first direction and said companion modular mating members are in the form of tracks extending a second direction different from said first direction.

28. An electrical circuitry system as set forth in claim 27 wherein said primary-flattener comprises a first elastomeric band positioned between said main modular member and said primary-modular member.

29. An electrical circuitry system as set forth in claim 27 wherein said companion-flattener comprises a second elastomeric band positioned between said main modular member and said primary-modular member.

30. An electrical circuitry system as set forth in claim 29 wherein said first elastomeric band and said second elastomeric band are essentially identical and may be used interchangeably in the assembly of said connection device.

31. An electrical circuitry system as set forth in claim 17 further comprising:

a mother board having two opposite sides, said primary circuit surface being contained on one of said two sides;

a daughter card having two opposite sides, said companion circuit surface being contained on one of said two sides; and a flexible circuit strip which contains said interfacing circuit surface.

32. An electric circuitry system as set forth in claim 31 wherein said primary circuit surface includes a second set of electrical primary contacts which are arranged in a second certain primary-contact pattern and wherein said system further comprises:

a second companion circuit surface including a second set of electrical companion contacts which are arranged in a second certain companion-contact pattern;

a second interfacing surface including a second primary-interfacing section on which a second set of primary-interfacing electrical contacts are arranged in a pattern corresponding to said second primary-contact pattern and a second companion-interfacing section on which a second set of companion-interfacing contacts, which are electrically connected to said second set of said primary-interfacing contacts, are arranged in a pattern corresponding to said second companion-contact pattern; said second primary-interfacing section and said second companion-interfacing section being joined together in such a manner that limited relative movement therebetween is possible;

a second connection device which electrically couples said primary circuit surface to said second companion circuit surface via said second interfacing circuit surface; said second connection device including a second companion-positioner coupled to said second companion-interfacing section and to said second companion circuit surface in such a manner that said second companion-interfacing section is positioned between said second companion-positioner and said second companion circuit surface and said second set of companion-interfacing contacts are precisely positioned relative to said second set of companion-contacts; said second connection device further including a second primary-positioner coupled to said second primary-interfacing section and to said primary circuit surface in such a manner that said second primary-interfacing section is positioned between said second primary-positioner and said primary circuit surface, said second primary-positioner being adjustable, independently of said second companion-positioner and said first-mentioned companion-positioner, in two perpendicular directions defining a second primary adjustment area parallel to said primary circuit surface whereby said second set of primary-interfacing contacts may be precisely positioned relative to said second set of primary-contacts.

33. An electric circuitry system as set forth in claim 22 wherein said primary circuit surface includes a second set of electrical primary contacts which are arranged in a second certain primary-contact pattern and wherein said system further comprises:

a second companion circuit surface including a second set of electrical companion contacts which are arranged in a second certain companion-contact pattern;

a second interfacing surface including a second primary-interfacing section on which a second set of primary-interfacing electrical contacts are arranged in a pattern corresponding to said second primary-contact pattern and a second companion-interfacing section on which a second set of companion-interfacing contacts, which are electrically connected to said second set of said primary-interfacing contacts, are arranged in a pattern corresponding to said second companion-contact pattern; said second primary-interfacing section and said second companion-interfacing section being joined together in such a manner that limited relative movement therebetween is possible;

a second connection device which electrically couples said primary circuit surface to said second companion circuit surface via said second interfacing circuit surface; said second connection device including a second companion-positioner coupled to said second companion-interfacing section and to said second companion circuit surface in such a manner that said second companion-interfacing section is positioned between said second companion-positioner and said second companion circuit surface and said second set of companion-interfacing contacts are precisely positioned relative to said second set of companion-contacts; said second connection device further including a second primary-positioner coupled to said second primary-interfacing section and to said primary circuit surface in such a manner that said second primary-interfacing section is positioned between said second primary-positioner and said primary circuit surface, said second primary-positioner being adjustable, independently of said second companion-positioner and said first-mentioned companion-positioner, in two perpendicular directions defining a second primary adjustment area parallel to said primary circuit surface whereby said second set of primary-interfacing contacts may be precisely positioned relative to said second set of primary-contacts.

34. An electrical circuitry system as set forth in claim 33 further comprising a board frame member surrounding said companion circuit surfaces and mounting members for mounting said connection devices to said primary circuit surface.

35. An electrical circuitry system as set forth in claim 34 wherein said second companion circuit surface is contained on the other side of said two sides of said daughter card.

36. An electrical circuitry system as set forth in claim 35 further comprising:
a mother board having two opposite sides;
a nexus element having one side electrically coupled to said mother board and another side which at least partially contains said primary circuit surface and which completely contains said primary contacts;
a daughter card having two opposite sides, said companion circuit surface being contained on one of said two sides; and
a flexible circuit strip which contains said interfacing circuit surface.

37. An electrical circuitry system as set forth in claim 36 further comprising a second nexus element having one side electrically coupled to said mother board and another side which, along with said first nexus element, defines said primary circuit surface and which contains said second set of primary contacts.

38. A method of assembling an electrical circuitry system comprising:
providing a primary circuit surface including a set of electrical primary contacts which are arranged in a certain primary-contact pattern;
providing a companion circuit surface including a set of electrical companion contacts which are arranged in a certain companion-contact pattern;
providing a multi-section interfacing circuit section including a primary-interfacing section on which a set of primary-interfacing electrical contacts are arranged in a pattern corresponding to said primary-contact pattern and a companion-interfacing section on which a set of companion-interfacing contacts, which are electrically connected to said primary-interfacing contacts, are arranged in a pattern corresponding to said companion-contact pattern;
providing a connection device including a companion-coordinating side and a primary-coordinating side;
securing the primary-interfacing section of the interfacing circuit surface to the primary-coordinating side of the connection device;
securing the companion-interfacing section of the interfacing circuit surface of the companion-coordinating side of the connection device;
precisely positioning the companion-coordinating side of the connection device relative to the companion circuit surface in such a manner that the companion-interfacing contacts are precisely aligned with the companion contacts; and
manipulating the primary-coordinating side of the connection device, independently of the companion-coordinating side and in a primary adjustment plane parallel to the primary coordinating side, in such a manner that primary-interfacing contacts are precisely aligned with the primary contacts.

39. A method as set forth in claim 38 further comprising the step of:
manipulating the companion-coordinating side of the connection device, independently of the primary-coordinating side and in a companion adjustment plane parallel to the companion coordinating side, in such a manner that companion-interfacing contacts are precisely aligned with the companion contacts.

* * * * *